US012603653B2

(12) United States Patent
Satake et al.

(10) Patent No.: US 12,603,653 B2
(45) Date of Patent: Apr. 14, 2026

(54) PULSE GENERATION CIRCUIT

(71) Applicant: Asahi Kasei Microdevices Corporation, Tokyo (JP)

(72) Inventors: Eriko Satake, Tokyo (JP); Shinichi Tamaki, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 21 days.

(21) Appl. No.: 18/922,424

(22) Filed: Oct. 22, 2024

(65) Prior Publication Data

US 2025/0158622 A1 May 15, 2025

(30) Foreign Application Priority Data

Nov. 9, 2023 (JP) ................................. 2023-191513

(51) Int. Cl.
H03L 7/081 (2006.01)
H03L 7/089 (2006.01)
(52) U.S. Cl.
CPC .......... H03L 7/0812 (2013.01); H03L 7/0895 (2013.01)
(58) Field of Classification Search
CPC ... H03L 7/0812; H03L 7/0895; H03L 7/0891; H03L 7/07; H03L 7/0816; H03L 7/089; H03K 2005/00045; H03K 5/135; H03K 2005/00026; H03K 2005/00019; H03K 5/133; H03K 5/134; G11C 7/222
See application file for complete search history.

(56) References Cited

U.S. PATENT DOCUMENTS

| 5,883,534 A | 3/1999 | Kondoh |
| 6,100,735 A | 8/2000 | Lu |
| 2006/0176091 A1 | 8/2006 | Sakiyama |
| 2007/0222494 A1* | 9/2007 | Ariyoshi ................ H03K 5/133 |
| | | 327/276 |
| 2009/0179675 A1 | 7/2009 | Lee |
| 2020/0363506 A1 | 11/2020 | Shen |
| 2021/0302547 A1 | 9/2021 | Ozeki |

FOREIGN PATENT DOCUMENTS

JP 2010200364 A 9/2010

* cited by examiner

*Primary Examiner* — Jung Kim

(57) ABSTRACT

Provided is a pulse generation circuit that receives a clock signal and outputs a delayed pulse signal, including: a first delay-locked loop circuit that receives the clock signal and generates a first delay signal obtained by delaying the clock signal; a second delay-locked loop circuit that generates a second delay signal with reference to the first delay signal; and an output circuit that outputs the delayed pulse signal according to the first delay signal and the second delay signal. The second delay-locked loop circuit may have: a second charge pump that outputs a current according to the clock signal and the delayed pulse signal; and a second delay circuit that outputs the second delay signal obtained by delaying the clock signal according to a current output by the second charge pump.

7 Claims, 20 Drawing Sheets

330

630

CNT_IUP → 415

405

UP

435

I_UP2

I_DN2

DN

445

CNT_IDN → 425

PULSE GENERATION CIRCUIT

The contents of the following patent application(s) are incorporated herein by reference:

NO. 2023-191513 filed in JP on Nov. 9, 2023

BACKGROUND

1. Technical Field

The present invention relates to a pulse generation circuit.

2. Related Art

In Patent Document 1, it is described that "a first DLL circuit 5A compares a first timing signal 101A and a first edge separation signal 111A to determine a phase of a rising edge of a light emission control signal 104. A second DLL circuit 5B compares a second timing signal 101B and a second edge separation signal 111B to determine a phase of a falling edge of the light emission control signal 104."

PRIOR ART DOCUMENTS

Patent Document

Patent Document 1: International Publication No. 2020/129954

DESCRIPTION OF EXEMPLARY EMBODIMENTS

Hereinafter, embodiments of the present invention will be described. However, the following embodiments are not for limiting the invention according to the claims. In addition, not all of the combinations of features described in the embodiments are essential to the solution of the invention.

Figure 1:
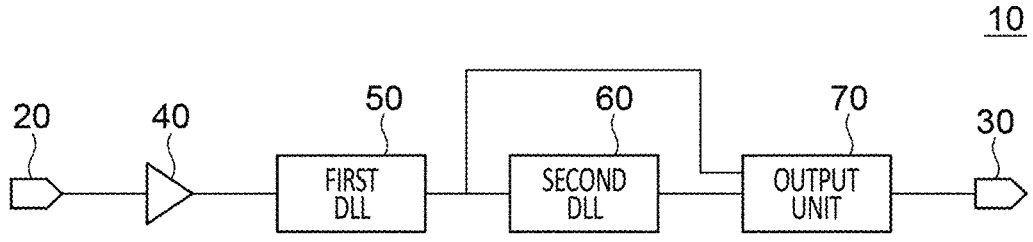
FIG. 1 illustrates a schematic view of a pulse generation circuit 10 in the present embodiment.

FIG. 1 illustrates a schematic view of a pulse generation circuit 10 in the present embodiment. The pulse generation circuit 10 receives a clock signal at an input terminal 20, and delays the clock signal to generate and output a delayed pulse signal. The pulse generation circuit 10 may be included in a ToF (Time of Flight) system that emits light and uses the time it takes for the reflected light from the object to return, to measure a distance to the object. In the Tof system, the pulse generation circuit 10 can be used in a current driver that outputs a light pulse according to the delayed pulse signal generated by the pulse generation circuit 10.

The pulse generation circuit 10 includes an input buffer 40, a first delay-locked loop circuit 50 (a first DLL in FIG. 1), a second delay-locked loop circuit 60 (a second DLL in FIG. 1) and an output circuit 70.

The input buffer 40 is coupled to the input terminal 20. The input buffer 40 outputs a clock signal input at the input terminal 20 into the first delay-locked loop circuit 50.

The first delay-locked loop circuit 50 is coupled to the input buffer 40, and generates a first delay signal obtained by delaying the input clock signal. The first delay-locked loop circuit 50 may generate the first delay signal obtained by delaying the clock signal according to the clock signal and a fed back delayed pulse signal. The first delay-locked loop circuit 50 may generate a constant delay by locking phases of the clock signal and the delayed pulse signal. When the input clock signal is a signal that can be directly received by the first delay-licked loop circuit 50, the input buffer 40 may be omitted. More detailed configurations are described in FIG. 2 to FIG. 5.

The second delay-locked loop circuit 60 is coupled in series to the first delay-locked loop circuit 50, and generates a second delay signal with reference to the first delay signal from the first delay-locked loop circuit 50. More detailed configurations are described in FIG. 6 to FIG. 8.

The output circuit 70 is coupled to the first delay-locked loop circuit 50, the second delay-locked loop circuit 60 and the output terminal 30. The output circuit 70 outputs a delayed pulse signal to the output terminal 30 according to the first delay signal and the second delay signal.

Figure 2:
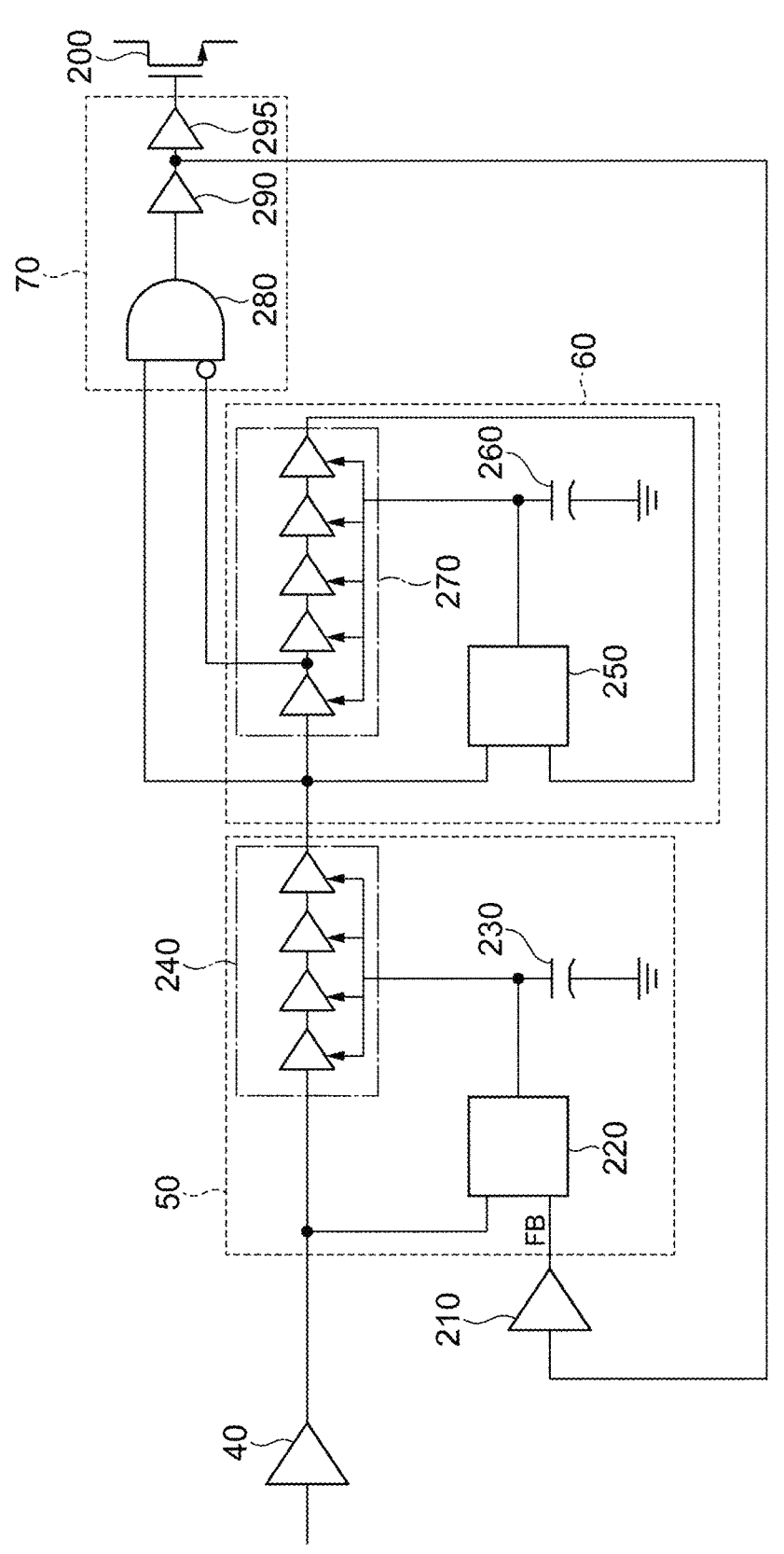
FIG. 2 illustrates a first exemplary configuration of the pulse generation circuit 10.

FIG. 2 illustrates a first exemplary configuration of the pulse generation circuit 10. FIG. 2 is an example showing the pulse generation circuit 10 illustrated in FIG. 1 in more details. The pulse generation circuit 10 includes an output driver 200 and a dummy input buffer 210 in addition to the configurations illustrated in FIG. 1.

The output driver 200 may be a MOS or a bipolar transistor coupled to the output circuit 70. The output driver 200 causes a current to flow according to the delayed pulse signal output by the output circuit 70.

The dummy input buffer 210 has its input coupled to the output circuit 70 and its output coupled to the first delay-locked loop circuit 50. The dummy input buffer 210 feeds back the delayed pulse signal output from the output circuit 70 to the first delay-locked loop circuit 50. The dummy input buffer 210 may be arranged to adjust the phase or the like of the signal with respect to the input buffer 40.

The first delay-locked loop circuit 50 has a first delay control unit 220, a first capacitor 230 and a first delay circuit 240. The first delay control unit 220 has its input coupled to the input buffer 40 and the dummy input buffer 210. The first delay control unit 220 outputs a current according to the clock signal and the delayed pulse signal. The first delay control unit 220 may output a current corresponding to a delay amount of delaying the clock signal in the first delay-locked loop circuit 50.

The first capacitor 230 is coupled between a node to which the output of the first delay control unit 220 is coupled and reference potential. The first capacitor 230 has electric charges charged or discharged by the current output by the first delay control unit 220.

The first delay circuit 240 is coupled between the input buffer 40 and the second delay-locked loop circuit 60, and coupled to the opposite side of the reference potential of the first capacitor 230. The first delay circuit 240 delays the clock signal and outputs the first delay signal according to the voltage at the node to which the output of the first delay control unit 220 is coupled.

The second delay-locked loop circuit 60 has a second delay control unit 250, a second capacitor 260 and a second delay circuit 270. The second delay control unit 250 has its input coupled to the output of the first delay circuit 240 of the first delay-locked loop circuit 50, and the output of the second delay circuit 270. The second delay control unit 250 outputs current according to the first delay signal output by the first delay-locked loop circuit 50 and the second delay signal fed back from the second delay circuit 270. The second delay control unit 250 may output a current corresponding to a delay amount of delaying the first delay signal in the second delay-locked loop circuit 60.

The second capacitor 260 is coupled between the node to which the output of the second delay control unit 250 is coupled and the reference potential. The second capacitor 260 has electric charges charged or discharged by the current output by the second delay control unit 250.

The second delay circuit 270 is coupled to the output of the first delay circuit 240, and coupled to the opposite side of the reference potential of the second capacitor 260. The second delay circuit 270 delays the first delay signal, generates and outputs the second delay signal according to the voltage at the node to which the output of the second delay control unit 250 is coupled.

The output circuit 70 has a coupling circuit 280, a predriver 290 and a predriver 295. The coupling circuit 280 has its one input coupled to the first delay-locked loop circuit 50, and its another input coupled to the second delay-locked loop circuit 60. The coupling circuit 280 combines the first delay signal and the second delay signal. The coupling circuit 280 may generate and output a delayed pulse signal that rises when the first delay signal has changed and falls when the second delay signal has changed by taking the logical product of the first delay signal on one input and the second delay signal on another input.

The predriver 290 and the predriver 295 output the delayed pulse signal. The node between the predriver 290 and the predriver 295 is coupled to a feedback path that is coupled to the first delay control unit 220 of the first delay-locked loop circuit 50.

Figure 3:
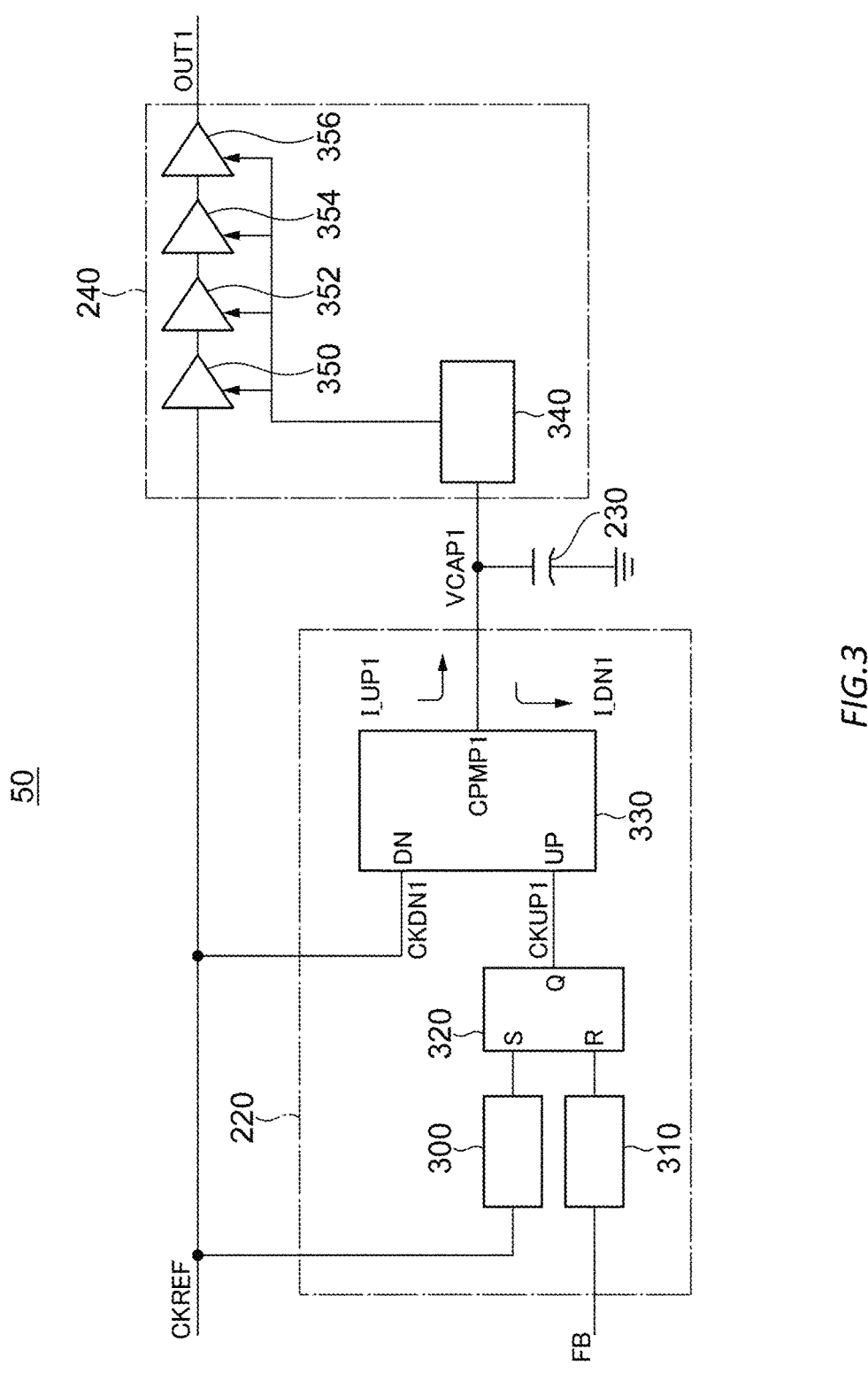
FIG. 3 illustrates a more detailed configuration of a first delay-locked loop circuit 50.

FIG. 3 illustrates a more detailed configuration of the first delay-locked loop circuit 50. The first delay control unit 220 has a first pulse generation unit 300, a second pulse generation unit 310, a first latch unit 320 and a first charge pump 330.

The first pulse generation unit 300 has its input coupled to the input terminal 20 through the input buffer 40, and its output coupled to the first latch unit 320. The first pulse generation unit 300 may generate the first pulse signal with a predetermined pulse width that rises when the input clock signal CKREF has changed. The first pulse generation unit 300 may output the first pulse signal to one input of the first latch unit 320.

The second pulse generation unit 310 has its input coupled to the output circuit 70 through the dummy input buffer 210, and its output coupled to the first latch unit 320. The second pulse generation unit 310 generates the second pulse signal with a predetermined pulse width that rises when the fed back delayed pulse signal FB has changed. The second pulse generation unit 310 may output the second pulse signal to another input of the first latch unit 320.

The first latch unit 320 has its output coupled to one input of the first charge pump 330. The first latch unit 320 outputs a first control signal CKUP1 according to the first pulse signal and second pulse signal that are input. The first latch unit 320 may perform SR latch according to the first pulse signal and the second pulse signal and output the first control signal CKUP1.

The first charge pump 330 has its another input coupled to the input terminal 20 through the input buffer 40, and its output coupled to the node between the first capacitor 230 and the first delay circuit 240. The first charge pump 330 outputs a current according to the clock signal CKREF and the delayed pulse signal FB. The first charge pump 330 receives the clock signal CKREF as the second control signal CKDN1, and outputs a current I_UP1/I_DN1 according to the first control signal CKUP and the second control signal CKDN. The first charge pump 330 may change the direction of the current I_UP1/I_DN1 according to the first control signal CKUP1 and a second control signal CKDN1, and perform charging or discharging on the first capacitor 230. In this manner, the charging or discharging of the first capacitor 230 increases or decreases the voltage VCAP1 at the node between the first capacitor 230 and the first delay circuit 240.

The first delay circuit 240 outputs the first delay signal OUT1 obtained by delaying the clock signal CKREF according to the current output by the first charge pump 330. The first delay circuit 240 has a first current application unit 340 and a plurality of buffers 350, 352, 354, 356. The first current application unit 340 is coupled to the opposite side of the reference potential of the first capacitor 230 (the node between the first capacitor 230 and the first delay circuit 240). The first current application unit 340 supplies the current according to the voltage VCAP1 at the node between the first capacitor 230 and the first delay circuit 240 to the plurality of buffers 350, 352, 354, 356. The plurality of buffers 350, 352, 354, 356 are coupled to the first current application unit 340, and coupled between the input buffer 40 and the output circuit 70 (and the second delay-locked loop circuit 60) in series in a plurality of stages. Each of the buffers 350, 352, 354, 356 may have two inverters coupled in series as one example.

Figure 4:
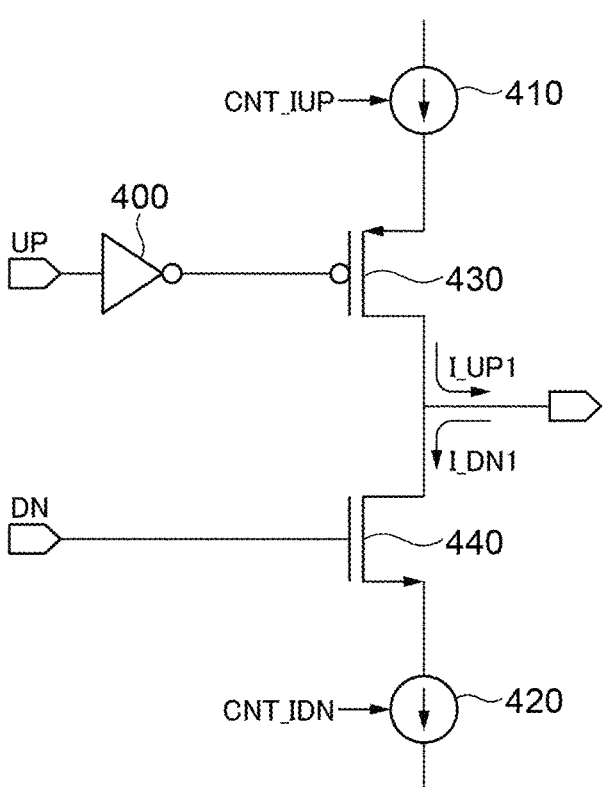
FIG. 4 illustrates a more detailed configuration example of a first charge pump 330.

FIG. 4 illustrates a more detailed configuration example of the first charge pump 330. The first charge pump 330 may receive the first control signal CKUP1 output from the first latch unit 320 and the second control signal CKDN1 from the input buffer 40, and output the current I_UP1/I_DN1 according to the first control signal CKUP1 and the second control signal CKDN1. The first charge pump 330 has an inverter 400, a first current source 410, a second current source 420, a first transistor 430 and a second transistor 440.

The inverter 400 may be coupled between the terminal UP that receives the first control signal CKUP1 and the first transistor 430, and invert the logic level of the input first control signal CKUP1 for output. The first current source 410 may be coupled to the first transistor 430, and cause the current I_UP1 to flow with a magnitude according to the signal CNT_IUP to the first transistor 430. The first current source 410 may be a constant current source. The first transistor 430 is coupled to the output and controls the energization/shutdown of the current I_UP1 toward the output according to the first control signal CKUP1 applied to the control terminal (gate terminal).

The second current source 420 may be coupled to the second transistor 440, and cause the current I_DN1 to flow with a magnitude according to the signal CNT_IDN from the second transistor 440. The second current source 420 may be a constant current source. The second transistor 440 is coupled to the output, and controls energization/shutdown of the current I_DN1 from the output to the second current source 420 according to the second control signal CKDN1 flowing from a terminal DN to the control terminal. With this configuration, for example, the first charge pump 330 may output the current I_UP1 when only the first control signal CKUP1 is high, draw the current I_DN1 when only the second control signal CKDN1 is high, and output the difference of the currents (I_UP1–I_DN1) when both the first control signal CKUP1 and the second control signal CKDN1 are high.

The first current source 410 can control the magnitude of the current I_UP1 by the signal CNT_IUP, and the second current source 420 can control the magnitude of the current I_DN1 by the signal CNT_IDN. In this manner, the ratio of the current I_UP1 of the first current source 410 to the current I_DN1 of the second current source 420 is controlled by the first charge pump 330 according to the input condition of the clock signal CKREF and the delay time (delay amount) required for the delayed pulse signal OUT.

Figure 5:
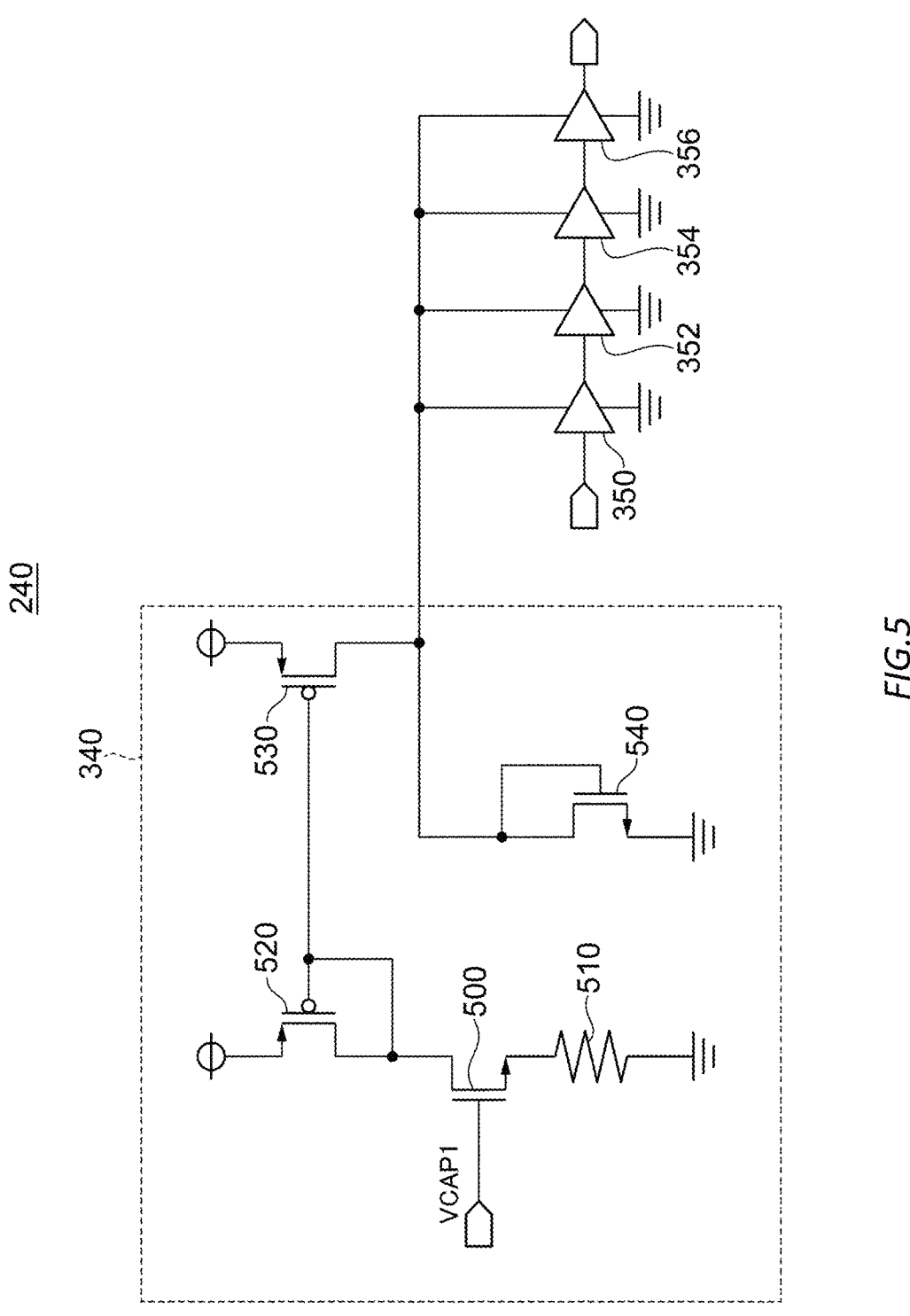
FIG. 5 illustrates a more detailed configuration example of a first current application unit 340 together with a plurality of buffers.

FIG. 5 illustrates a more detailed configuration example of the first current application unit 340 together with a plurality of buffers 350, 352, 354, 356. The first current application unit 340 has a third transistor 500, a resistance 510, a fourth transistor 520, a fifth transistor 530 and a sixth transistor 540. The third transistor 500 is coupled to one end of the resistance 510, and has its control terminal coupled to the first capacitor 230. The resistance 510 has its another end coupled to the reference potential. The fourth transistor 520 is coupled between the power supply and the third transistor 500, and has its control terminal coupled to the control terminal of the fifth transistor 530 and a node between the third transistor 500 and the fourth transistor 520. The fifth transistor 530 is coupled between the power supply and one end of the sixth transistor 540. The sixth transistor 540 has its another end coupled to the reference potential, and has its control terminal coupled to a node between the fifth transistor 530 and one end of the sixth transistor 540.

Each of the plurality of buffers 350, 352, 354, 356 is coupled between the node between one end of the fifth transistor 530 and one end of the sixth transistor 540 and the reference potential, and is coupled in series between the input buffer 40 and the output circuit 70.

The first delay circuit 240 receives the voltage VCAP1 charged or discharged in the first capacitor 230 at the third transistor 500 to generate a current. The first delay circuit 240 supplies the generated current to the plurality of buffers 350, 352, 354, 356 via a current mirror consisting of the fourth transistor 520 and the fifth transistor 530. The larger the current supplied, the smaller the delay of each of the buffers 350, 352, 354, 356, and the smaller the current supplied, the larger the delay of each of the buffers 350, 352, 354, 356.

In the present embodiment, buffers 350, 352, 354, 356 in four stages were used, but the buffers in the first delay circuit 240 may be in 5 or more or less than 4 stages according to the circuit application. It is also possible to generate a multiphase clock by having signals output from each of the buffers 350, 352, 354, 356.

Figure 6:
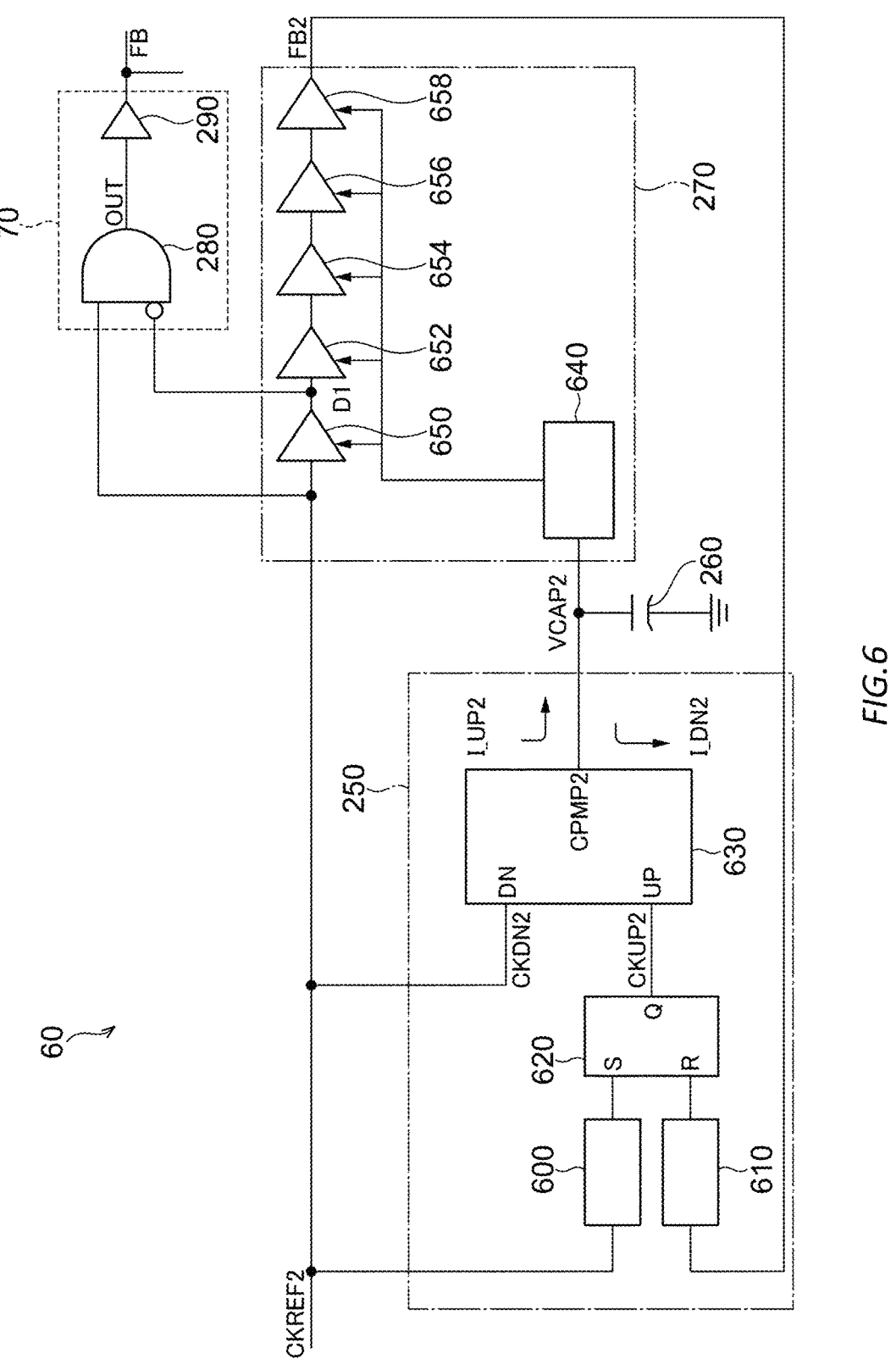
FIG. 6 illustrates a more detailed configuration of a second delay-locked loop circuit 60 together with an output circuit 70.

FIG. 6 illustrates a more detailed configuration of the second delay-locked loop circuit 60 together with the output circuit 70. The second delay control unit 250 has a third pulse generation unit 600, a fourth pulse generation unit 610, a second latch unit 620 and a second charge pump 630.

The third pulse generation unit 600 has its input coupled to the output of the first delay-locked loop circuit 50, and its output coupled to the second latch unit 620. The third pulse generation unit 600 may generate a third pulse signal with a predetermined pulse width that rises when the first delay signal CKREF2 (OUT1) output from the first delay-locked loop circuit 50 has changed (for example, has risen). The third pulse generation unit 600 may output the third pulse signal to one input of the second latch unit 620.

The fourth pulse generation unit 610 has its input coupled to the output of the second delay circuit 270, and its output coupled to the second latch unit 620. The fourth pulse generation unit 610 generates a fourth pulse signal according to a second delay signal FB2 fed back from the second delay circuit 270. The fourth pulse generation unit 610 generates the fourth pulse signal with a predetermined pulse width that rises when the second delay signal FB2 has changed (for example, has risen). The fourth pulse generation unit 610 may output the fourth pulse signal to another input of the second latch unit 620.

The second latch unit 620 has its output coupled to one input of the second charge pump 630. The second latch unit 620 outputs the third control signal CKUP2 according to the third pulse signal and the fourth pulse signal that are input. The second latch unit 620 may perform the SR latch according to the third pulse signal and the fourth pulse signal, and output the third control signal CKUP2 according to the second delay signal FB2.

The second charge pump 630 has its another input coupled to the output of the first delay-locked loop circuit 50, and has its output coupled to the node between the second capacitor 260 and the second delay circuit 270. The second charge pump 630 outputs a current corresponding to a predetermined delay amount of the second delay signal FB2. The second charge pump 630 may output a current according to a signal based on the clock signal and the delayed pulse signal. The second charge pump 630 may output a current according to a first delay signal CKREF2, and a delay difference between the first delay signal CKREF2 and the second delay signal FB2. The second charge pump 630 may receive the first delay signal CKREF2 as the fourth control signal CKDN2, and output the current I_UP2/I_DN2 according to the third control signal CKUP2 and the fourth control signal CKDN2, which are according to the second delay signal FB2. The second charge pump 630 may change the direction of the current I_UP2/I_DN2 according to the third control signal CKUP2 and the fourth control signal CKDN2, and perform charging or discharging on the second capacitor 260. The second capacitor 260 is coupled between the node to which the output of the second charge pump 630 is coupled and the reference potential. In this manner, the charging or discharging of the second capacitor 260 increases or decreases the voltage VCAP2 at the node between the second capacitor 260 and the second delay circuit 270.

The second delay circuit 270 outputs the second delay signal FB2 obtained by delaying the first delay signal CKREF2 with a predetermined delay amount according to the current output by the second charge pump 630. The second delay circuit 270 may output the second delay signal FB2 obtained by delaying the first delay signal CKREF2 with a delay amount according to a ratio of a charge current I_UP2 that performs charging of the second capacitor 260 and a discharge current I_DN2 that performs discharging of the second capacitor 260, which are output by the second charge pump 630.

The second delay circuit 270 has a second current application unit 640 and a plurality of buffers 650, 652, 654, 656, 658. The second current application unit 640 is coupled to the opposite side of the reference potential of the second capacitor 260 (the node between the second capacitor 260 and the second delay circuit 270). The second current application unit 640 supplies the current according to the voltage VCAP2 at the node between the second capacitor 260 and the second delay circuit 270 to the plurality of buffers 650, 652, 654, 656, 658. The plurality of buffers 650, 652, 654, 656, 658 are coupled to the second current application unit 640, and coupled in series between the first delay-locked loop circuit 50 and the output circuit 70. In FIG. 6, although the output of the buffer 650 is coupled to the coupling circuit 280, it is not limited thereto, the output of either one of the buffers 650, 652, 654, 656, 658 may be coupled to the coupling circuit 280 according to the required delay amount (the pulse width of the delayed pulse signal).

Figure 7:
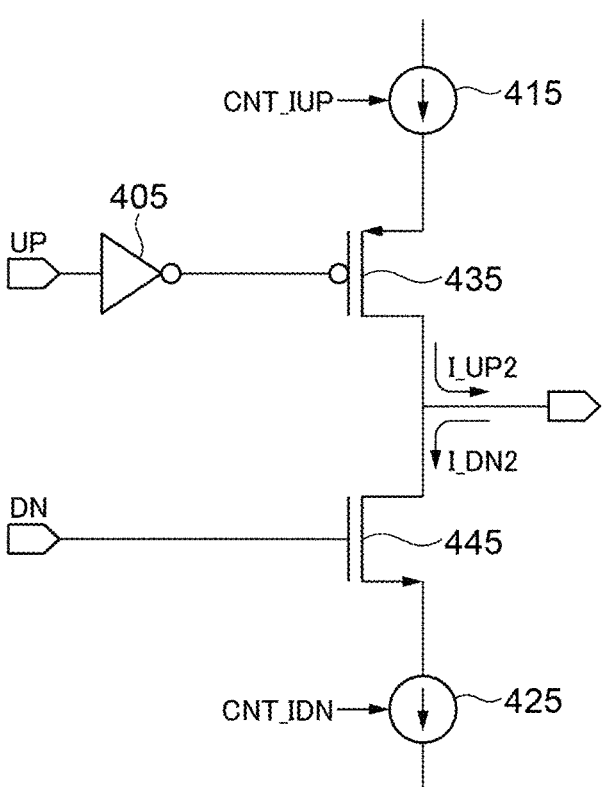
FIG. 7 illustrates a more detailed configuration example of a second charge pump 630.

FIG. 7 illustrates a more detailed configuration example of the second charge pump 630. The second charge pump 630 may receive the third control signal CKUP2 output from the second latch unit 620 and the fourth control signal CKDN2 (CKREF2) from the first delay-locked loop circuit 50, and output the current I_UP2/I_DN2 according to the third control signal CKUP2 and the fourth control signal CKDN2. The second charge pump 630 has an inverter 405, a third current source 415, a fourth current source 425, a seventh transistor 435 and an eighth transistor 445.

The inverter 405 may be coupled between the terminal UP that receives the third control signal CKUP2 and the seventh transistor 435, and invert the logic level of the input third control signal CKUP2 for output. The third current source 415 may be coupled to the seventh transistor 435, and cause the current I_UP2 to flow with a magnitude according to the signal CNT_IUP to the seventh transistor 435. The third current source 415 may be a constant current source. The seventh transistor 435 is coupled to the output of the second charge pump 630 and controls the energization/shutdown of the current I_UP2 toward the output according to the third control signal CKUP2 applied to the control terminal (gate terminal).

The fourth current source 425 may be coupled to the eighth transistor 445, and cause the current I_DN2 to flow with a magnitude according to the signal CNT_IDN from the eighth transistor 445. The fourth current source 425 may be a constant current source. The eighth transistor 445 is coupled to the output of the second charge pump 630, and controls the energization/shutdown of the current I_DN2 toward the fourth current source 425 from the output according to the fourth control signal CKDN2 flowing from the terminal DN to the control terminal. With this configuration, for example, the second charge pump 630 may output the current I_UP2 when only the third control signal CKUP2 is high, draw the current I_DN2 when only the fourth control signal CKDN2 is high, and output the difference of the currents (I_UP2−I_DN 2) when both the third control signal CKUP2 and the fourth control signal CKDN2 are high.

The third current source 415 can control the magnitude of the current I_UP2 by the signal CNT_IUP, and the fourth current source 425 can control the magnitude of the current I_DN2 by the signal CNT_IDN. In this manner, the ratio of the current I_UP2 of the third current source 415 to the current I_DN2 of the fourth current source 425 may be controlled by the second charge pump 630 according to the pulse width required for the delayed pulse signal OUT. Herein, the signals CNT_IUP and CNT_IDN in the second charge pump 630 may be identical to or different from the signals CNT_IUP and CNT_IDN in the first charge pump 330.

Figure 8:
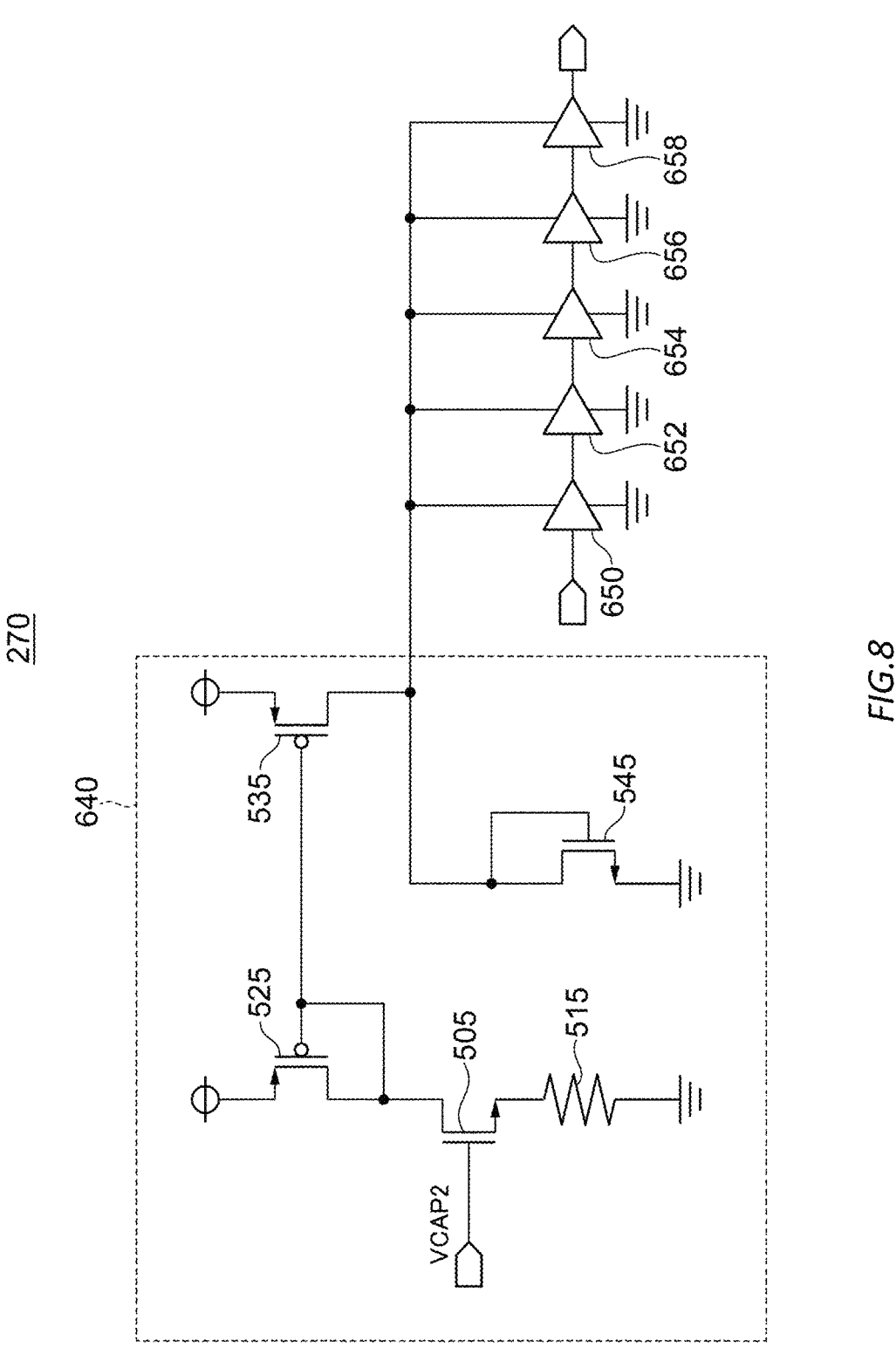
FIG. 8 illustrates a more detailed configuration example of a second current application unit 640 together with a plurality of buffers.

FIG. 8 illustrates a more detailed configuration example of the second current application unit 640 together with a plurality of buffers 650, 652, 654, 656, 658. The second current application unit 640 has a ninth transistor 505, a resistance 515, a tenth transistor 525, an eleventh transistor 535, and a twelfth transistor 545. The ninth transistor 505 is coupled to one end of the resistance 515, and has its control terminal coupled to the second capacitor 260. The resistance 515 has its another end coupled to the reference potential. The tenth transistor 525 is coupled between the power supply and the ninth transistor 505, and has its control terminal coupled to the control terminal of the eleventh transistor 535 and a node between the ninth transistor 505 and the tenth transistor 525. The eleventh transistor 535 is coupled between the power supply and one end of the twelfth transistor 545. The twelfth transistor 545 has its another end coupled to the reference potential, and has its control terminal coupled to a node between the eleventh transistor 535 and one end of the twelfth transistor 545.

Each of the plurality of buffers 650, 652, 654, 656, 658 is coupled between the node between one end of the eleventh transistor 535 and one end of the twelfth transistor 545 and the reference potential, and is coupled in series between the first delay circuit 240 and the second delay control unit 250 (and the output circuit 70) of the first delay-locked loop circuit 50.

The second delay circuit 270 receives the voltage VCAP2 charged or discharged in the second capacitor 260 with the ninth transistor 505 to generate a current. The second delay circuit 270 supplies the generated current to the plurality of buffers 650, 652, 654, 656, 658 via a current mirror consisting of the tenth transistor 525 and the eleventh transistor 535. The larger the current supplied, the smaller the delay of each of the buffers 650, 652, 654, 656, 658, and the smaller the current supplied, the larger the delay of each of the buffers 650, 652, 654, 656, 658.

In the present embodiment, buffers 650, 652, 654, 656, 658 in five stages were used, but the buffers in the second delay circuit 270 may be in 6 or more or less than 5 stages according to the circuit application.

Figure 9:
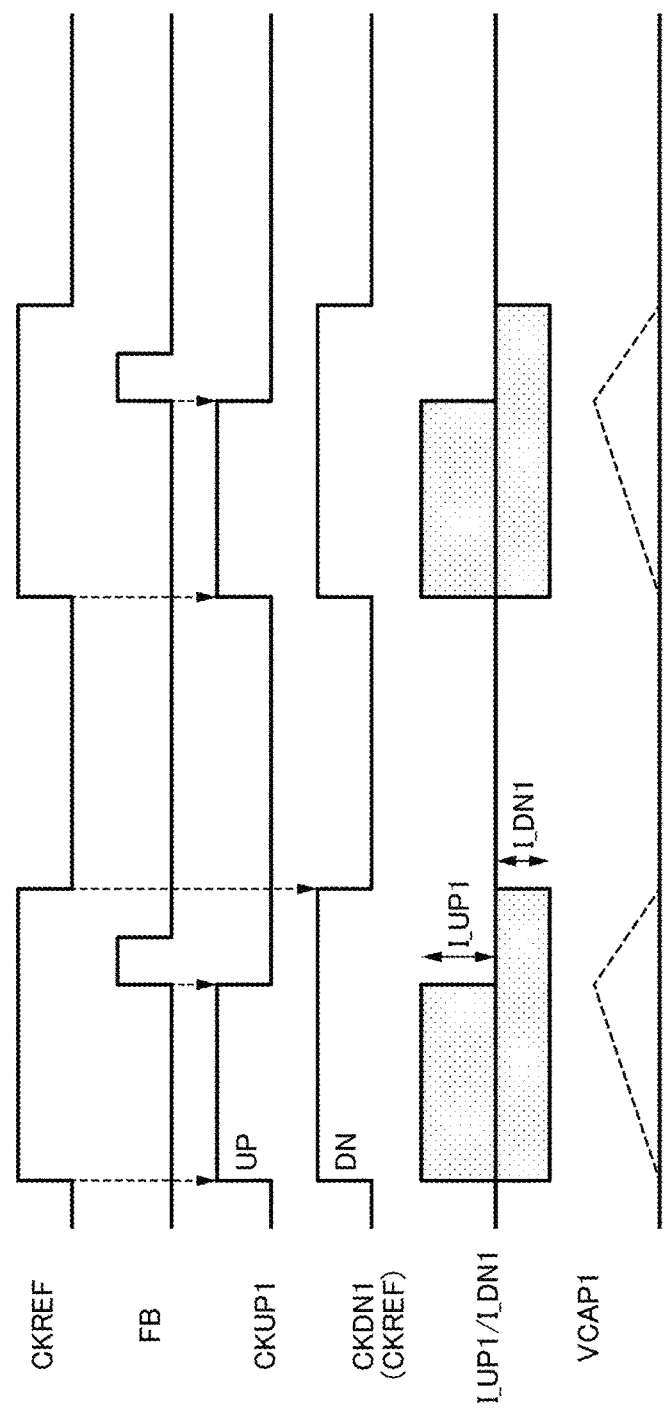
FIG. 9 illustrates one example of a timing chart of the first delay-locked loop circuit 50 in the present embodiment.

FIG. 9 illustrates one example of a timing chart of the first delay-locked loop circuit 50 in the present embodiment. In the timing chart, CKREF represents the input clock signal CKREF, FB represents the delayed pulse signal OUT output from the output circuit 70, CKUP1 represents the first control signal output from the first latch unit 320, CKDN1 represents the clock signal CKREF input to the first charge pump 330, I_UP1/I_DN1 represents the current output from the first charge pump 330, and VCAP1 represents the voltage of the first capacitor 230.

In FIG. 9, the first latch unit 320 detects first edges of the clock signal CKREF and the delayed pulse signal FB (odd-numbered edges thereafter) and inputs the first control signal CKUP1 according to the detection to the first charge pump 330.

The first control signal CKUP1 changes to one logic (a first logic) when the clock signal CKREF has changed to the first logic (high as one example) and changes to another logic (a second logic (low as one example)) when the delayed pulse signal FB has changed to the first logic. The second control signal CKDN1 changes to one logic (a first logic) when the clock signal CKREF has changed to the first logic and changes to another logic (a second logic) when the clock signal CKREF has changed to the second logic.

The first charge pump 330 charges the current I_UP1 to the first capacitor 230 from the first edge of the clock signal CKREF to the first edge of the delayed pulse signal FB by the first control signal CKUP1. On the other hand, the first charge pump 330 discharges the current I_DN1 from the first capacitor 230, from the first edge to the second edge of the clock signal CKREF (even-numbered edges thereafter) by the second control signal CKDN1. The current values of the current I_UP1 and the current I_DN1 may be set by the relationship between the clock signal CKREF and the delay of the delayed pulse signal FB. The first charge pump 330 charges the second capacitor 260 with the current difference I_UP2–I_DN2 from the first edge of the clock signal CKREF to the first edge of the delayed pulse signal FB to increase the voltage VCAP2, and discharges the current I_DN1 from the first edge of the delayed pulse signal FB to the second edge of the clock signal CKREF from the first capacitor 230 to decrease the voltage VCAP1 and restore the original level. This allows for a constant delay time to be generated.

Figure 10:
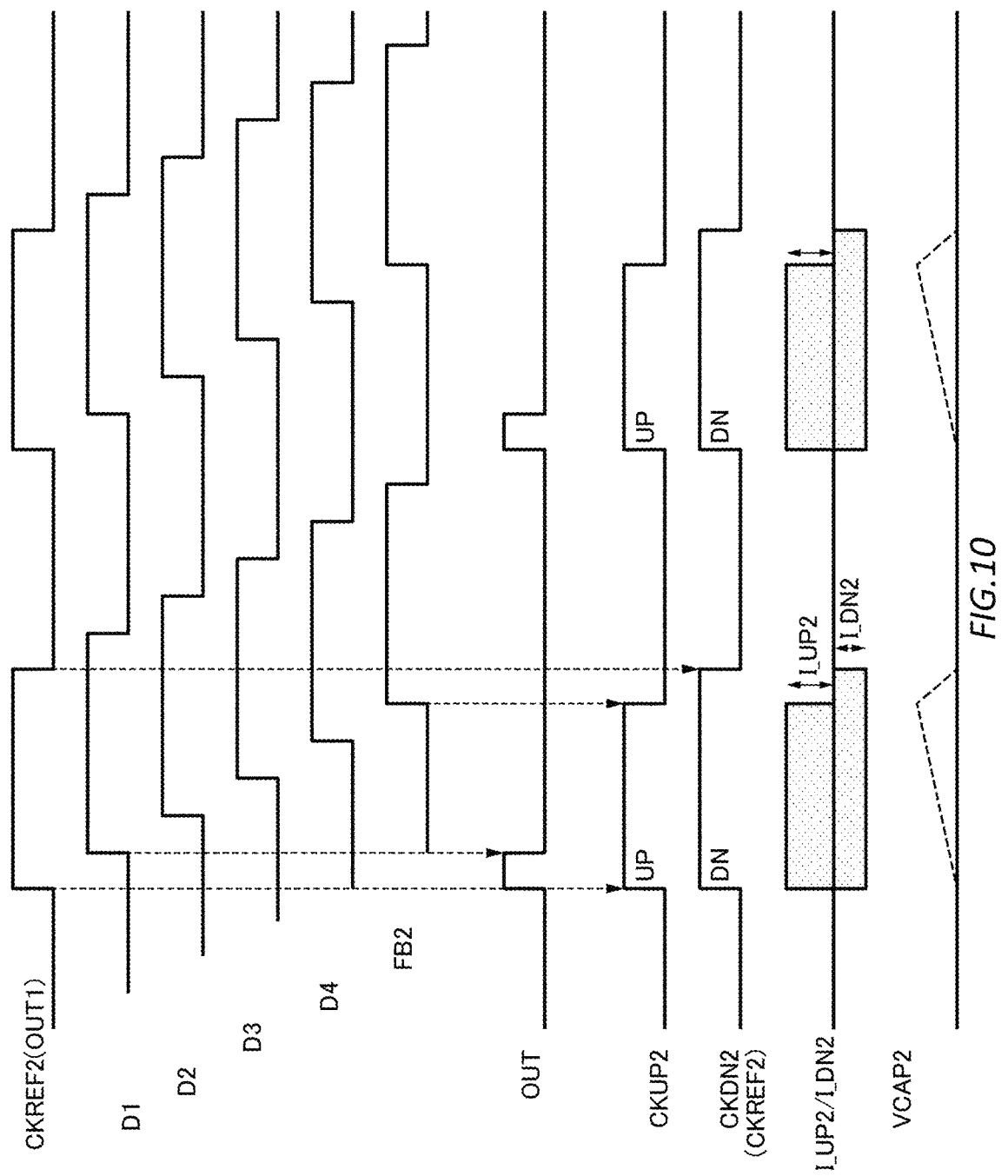
FIG. 10 illustrates one example of a timing chart of the second delay-locked loop circuit 60 in the present embodiment.

FIG. 10 illustrates one example of a timing chart of the second delay-locked loop circuit 60 in the present embodiment. In the timing chart, CKREF2 represents the first delay signal OUT1 output by the first delay-locked loop circuit 50, D1 represents the signal output from the buffer 650, D2 represents the signal output from the buffer 652, D3 represents the signal output from the buffer 654, D4 represents the signal output from the buffer 656, FB2 represents the signal output from the buffer 658, OUT represents the delayed pulse signal OUT output from the output circuit 70, CKUP2 represents the third control signal output from the second latch unit 620, CKDN2 represents the fourth control signal CKREF2 input to the second charge pump 630, I_UP2/I_DN2 represents the current output from the second charge pump 630, and VCAP2 represents the voltage of the second capacitor 260.

In FIG. 10, the second delay circuit 270 delays the first delay signal CKREF2 to output each of signals D1 to D4, FB2 by each of the buffers 650, 652, 654, 656, 658. The second latch unit 620 detects first edges of the first delay signal CKREF2 and the signal FB2 (odd-numbered edges thereafter) and inputs the third control signal CKUP2 according to the detection. The third control signal CKUP2 changes to one logic (a first logic) when the first delay signal CKREF2 has changed to the first logic (high as one example) and changes to another logic (a second logic (low as one example)) when the signal FB2 has changed to the first logic. The fourth control signal CKDN2 changes to one logic (a first logic) when the first delay signal CKREF2 has changed to the first logic and changes to another logic (a second logic) when the first delay signal CKREF2 has changed to the second logic.

The second charge pump 630 charges the current I_UP2 into the second capacitor 260 from the first edge of the first delay signal CKREF2 to the first edge of the signal FB2 by the third control signal CKUP2. On the other hand, the second charge pump 630 discharges the current I_DN2 from the second capacitor 260 from the first edge to the second edge of the first delay signal CKREF2 (even-numbered edges thereafter) by the fourth control signal CKDN2. The current values of the current I_UP2 and the current I_DN2 may be set by the relationship between the first delay signal CKREF2 and the delay of the signal FB2. The second charge pump 630 charges the second capacitor 260 with the current difference I_UP2–I_DN2 from the first edge of the first delay signal CKREF2 to the first edge of the signal FB2 to increase the voltage VCAP2, and discharges the current I_DN1 from the first edge of the signal FB2 to the second edge of the first delay signal CKREF2 from the second capacitor 260 to decrease the voltage VCAP2 and restore the original level. This allows for a constant delay time to be generated.

In the present embodiment, a relationship between a delay amount $P_{delay}$ of the delayed pulse signal OUT with respect to the clock signal CKREF, a pulse width $IN_{Width}$ of the clock signal CKREF and a current ratio (I_UP/I/DN) of the first charge pump 330 may be expressed as an expression of $P_{delay}=IN_{Width}\times I\_UP/I\_DN$.

Figure 11:
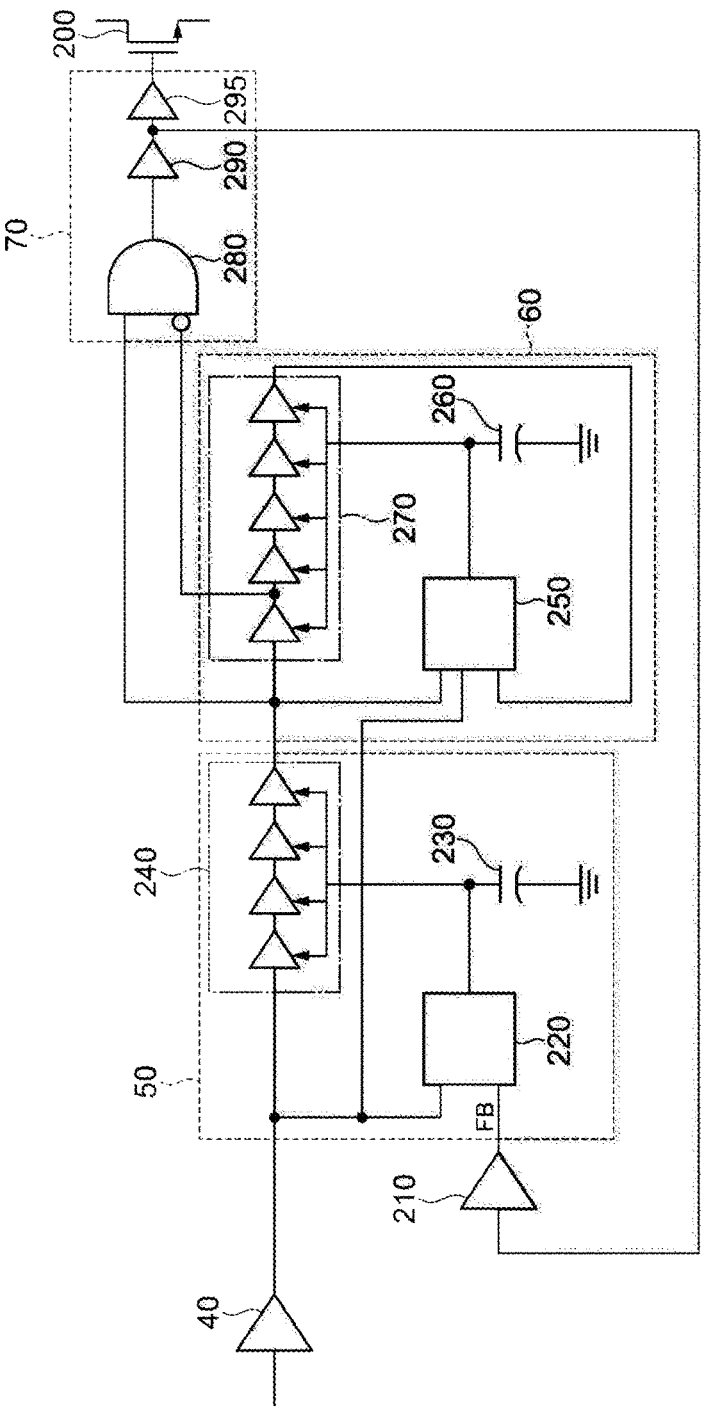
FIG. 11 illustrates a schematic view of a variant example of the pulse generation circuit 10 in the present embodiment.
Figure 12:
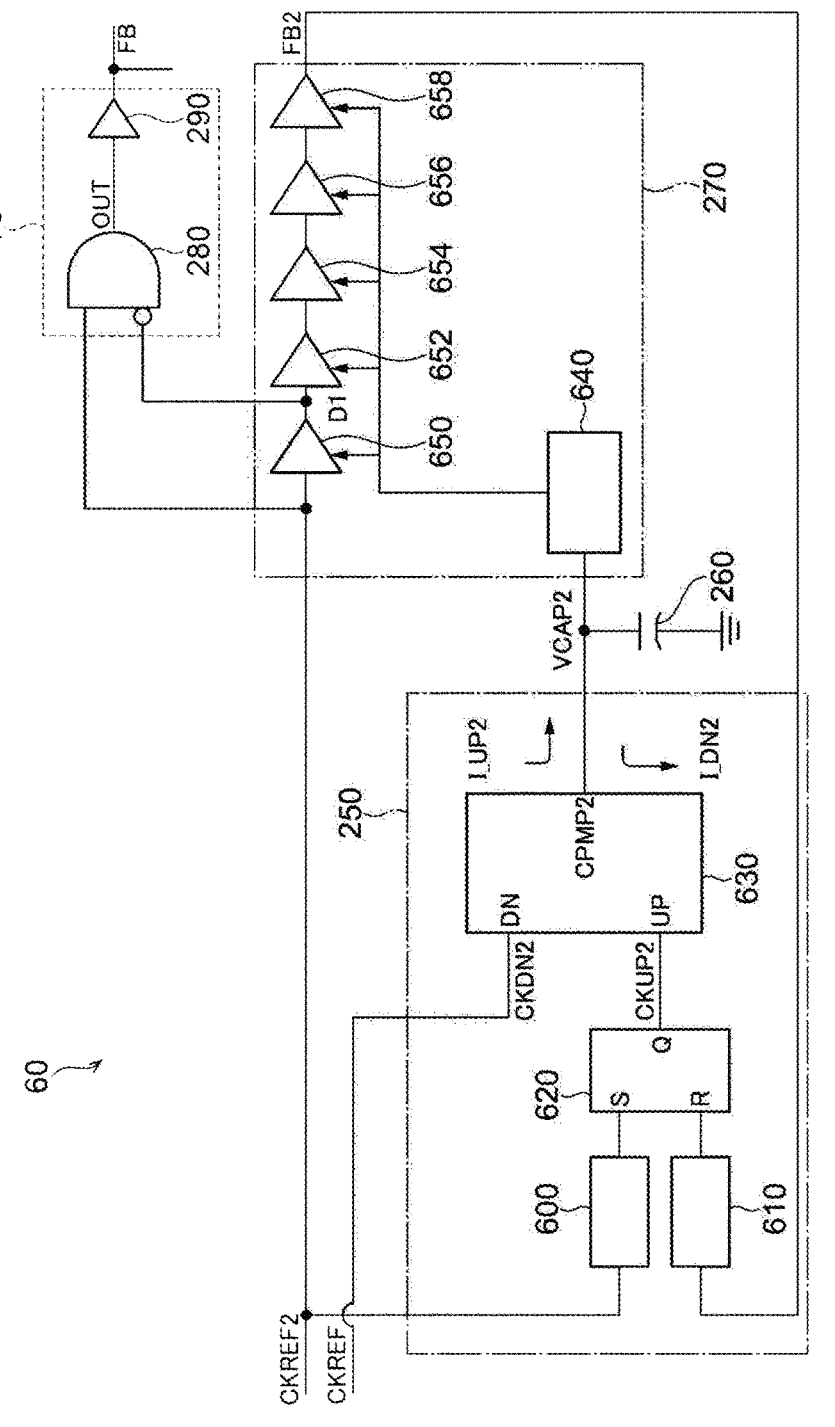
FIG. 12 illustrates a more detailed configuration of the second delay-locked loop circuit 60 in the variant example.
Figure 13:
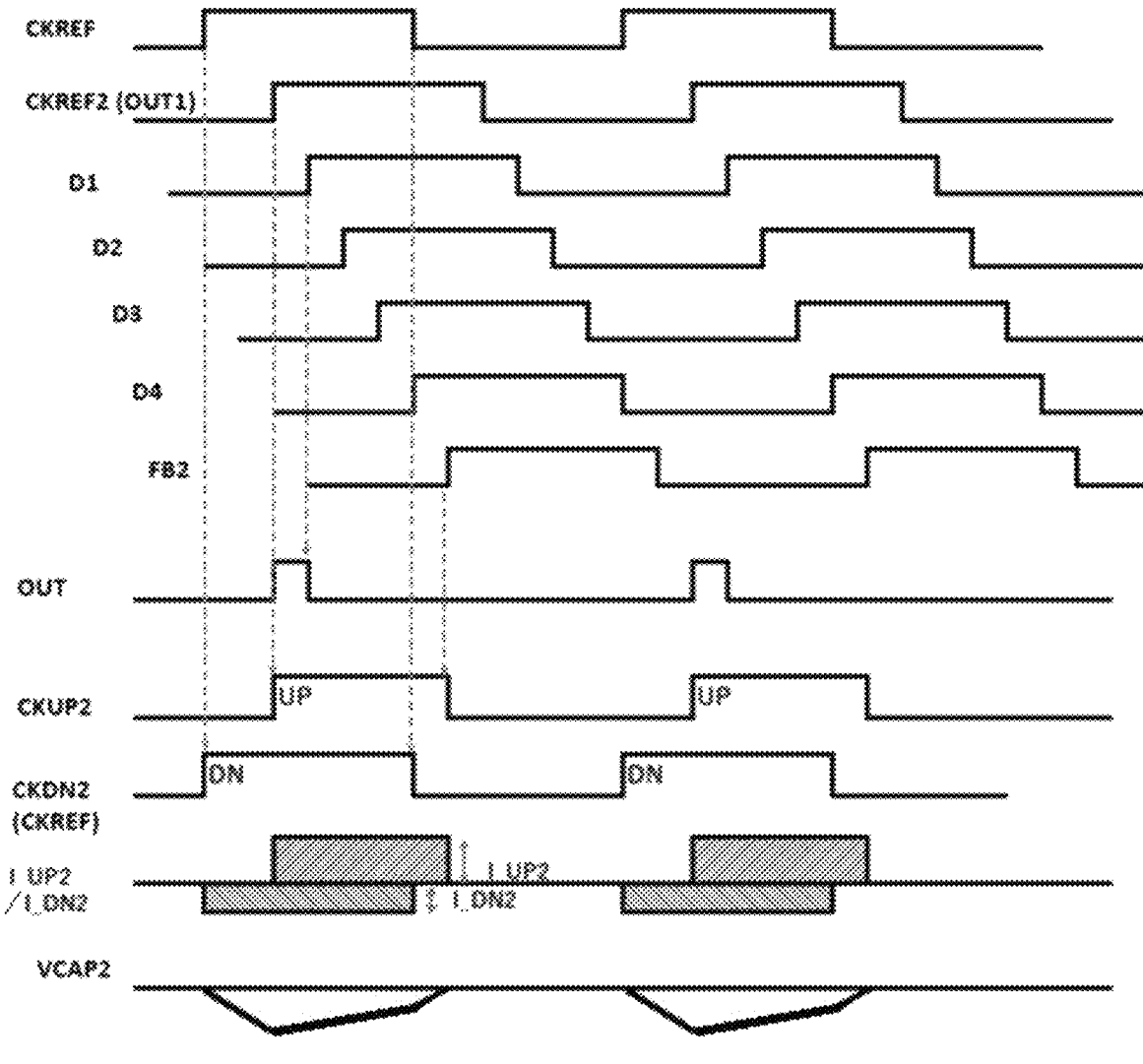
FIG. 13 illustrates one example of a timing chart of the second delay-locked loop circuit 60 in the variant example.

In the present embodiment, although the second delay control unit 250 outputs the current according to the first delay signal output by the first delay-locked loop circuit 50 and the second delay signal fed back from the second delay circuit 270, the second delay control unit 250 may output the current according to the output signal of the input buffer 40 instead of the first delay signal and the second delay signal. FIG. 11 illustrates a pulse generation circuit 10 of a variant example when the output signal of the input buffer 40 is used instead of the first delay signal by the second delay control unit 250. FIG. 12 illustrates the second delay-locked loop circuit 60 of the pulse generation circuit 10 in the variant example. FIG. 13 illustrates one example of a timing chart of the second delay-locked loop circuit 60 of the pulse generation circuit 10 in the variant example. In the variant example, the pulse generation circuit 10 may have a configuration and perform operations similar to the first exemplary configuration. In the following, the variant example of the pulse generation circuit 10 are described mainly in terms of the points that differ from the first exemplary configuration.

The second delay control unit 250 has its input coupled to the output of the input buffer 40, the output of the first delay circuit 240 of the first delay-locked loop circuit 50 and the output of the second delay circuit 270. The second delay control unit 250 outputs the current according to the output signal of the input buffer 40, the first delay signal output by the first delay-locked loop circuit 50 and the second delay signal fed back from the second delay circuit 270.

The second charge pump 630 has its another input coupled to the output of the input buffer 40, and its output coupled to the node between the second capacitor 260 and the second delay circuit 270. The second charge pump 630 outputs the current corresponding to a predetermined delay amount of the second delay signal FB2. The second charge pump 630 may output the current according to the clock signal CKREF and the delay difference between the first delay signal CKREF2 and the second delay signal FB2. The second charge pump 630 may receive the clock signal CKREF as the fourth control signal CKDN2, and output the current I_UP2/I_DN2 according to the third control signal CKUP2 and the fourth control signal CKDN2 that are according to the second delay signal FB2. The second charge pump 630 may change the direction of the current I_UP2/I_DN2 according to the third control signal CKUP2 and the fourth control signal CKDN2 and perform charging or discharging on the second capacitor 260. The second capacitor 260 is coupled between the node to which the output of the second charge pump 630 is coupled and the reference potential. In this manner, the charging or discharging of the second capacitor 260 increases or decreases the voltage VCAP2 at the node between the second capacitor 260 and the second delay circuit 270.

In the timing chart illustrated in FIG. 13, CKREF represents the input clock signal CKREF, CKREF2 represents the first delay signal OUT1 output by the first delay-locked loop circuit 50, D1 represents the signal output from the buffer 650, D2 represents the signal output from the buffer 652, D3 represents the signal output from the buffer 654, D4 represents the signal output from the buffer 656, FB2 represents the signal output from the buffer 658, OUT represents the delayed pulse signal OUT output from the output circuit 70, CKUP2 represents the third control signal output from the second latch unit 620, CKDN2 represents the fourth control signal CKREF input to the second charge pump 630, I_UP2/I_DN2 represents the current output from the second charge pump 630 and VCAP2 represents the voltage of the second capacitor 260.

The fourth control signal CKDN2 changes to one logic (the first logic) when the clock signal CKREF has changed to the first logic, and changes to another logic (the second logic) when the clock signal CKREF has changed to the second logic.

The second charge pump 630 charges the current I_UP2 into the second capacitor 260 from the first edge of the first delay signal CKREF2 to the first edge of the signal FB2 by the third control signal CKUP2. On the other hand, the second charge pump 630 discharges the current I_DN2 from the second capacitor 260 from the first edge to the second edge of the clock signal CKREF (even-numbered edges thereafter) by the fourth control signal CKDN2. The current values of the current I_UP2 and the current I_DN2 may be set by the relationship between the first delay signal CKREF2 and the delay of the signal FB2. The second charge pump 630 discharges the second capacitor 260 with the current I_DN2 from the first edge of the clock signal CKREF to the first edge of the first delay signal CKREF2 to decrease the voltage VCAP2, charges the second capacitor 260 with the current difference I_UP2–I_DN2 from the first edge of the first delay signal CKREF2 to the second edge of the clock signal CKREF to increase the voltage VCAP2, and charge the second capacitor 260 with the current I_UP2 from the second edge of the clock signal CKREF to the first edge of the signal FB2 to increase the voltage VCAP2 and restore the original level.

In the present embodiment as described above, because the pulse generation circuit 10 can set a delay by the first delay-locked loop circuit 50 and set a pulse width by the second delay-locked loop circuit 60 by delaying the first delay signal output by the first delay-locked loop circuit 50, the delayed pulse signal can be output accurately with the efficient structure. Because the delay amount of the delayed pulse signal can be determined by the current ratio of the clock signal CKREF to the first charge pump 330, a constant delay can be generated even if the period of the clock signal CKREF varies due to frequency spreading, etc., as long as the pulse width of the clock signal CKREF does not vary. The first delay-locked loop circuit 50 may be used to align the edges of the input (the clock signal CKREF) and output (the delayed pulse signal), and in cases where there is no need to generate a constant delay, the first delay-locked loop circuit 50 may include a phase comparator and may use a delay-locked loop circuit (DLL) configured to lock to align the input and output edges.

Figure 14:
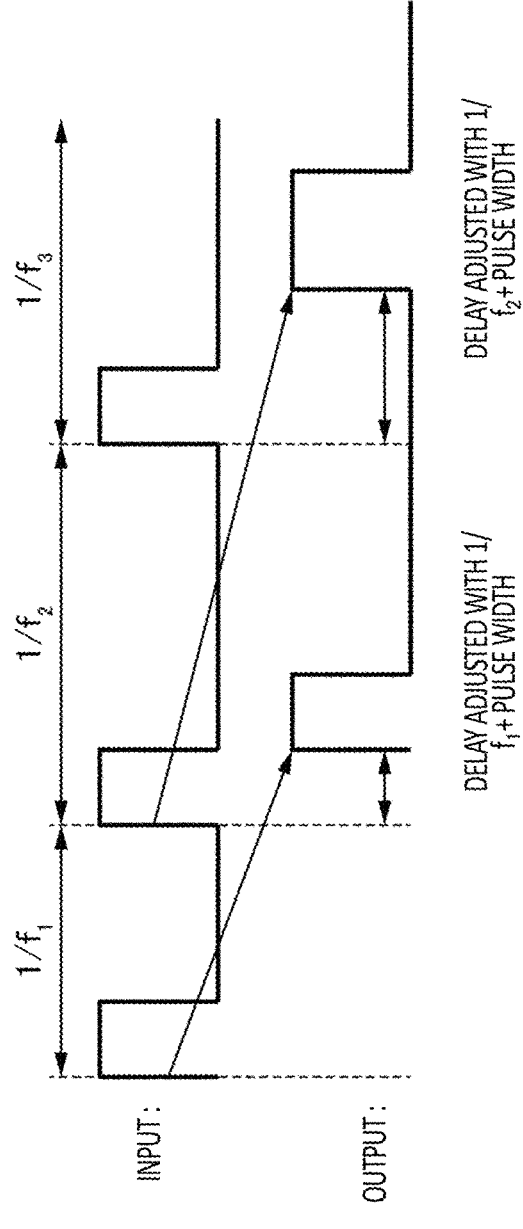
FIG. 14 illustrates a timing chart in a reference example when performing frequency-hopping in a ToF system.

FIG. 14 illustrates a timing chart in a reference example when performing frequency-hopping in the ToF system. As one example, as described in Patent Document 1, FIG. 14 illustrates a timing chart in a circuit in which a plurality of delay-locked loop circuits are coupled in parallel, one delay-locked loop circuit delays the clock signal to set the phase of the output pulse signal, and another delay-locked loop circuit delays the clock signal to set the pulse width of the output pulse signal. In FIG. 14, input represents the clock signal input to the plurality of delay-locked loop circuits, and output represents the delayed pulse signal output according to the output of the plurality of delay-locked loop circuits.

In the ToF system, the output pulse signal has peaks of several amperes and therefore has energy at a particular frequency. If this energy is too large, the released energy may affect the surrounding electronic equipment, and the ToF system may not function as it should. Because the peak current increases for long-distance measurements with ToF, it is desirable to relax radio disturbance (EMI). As one example of how to solve this problem, as shown in FIG. 14, "input", frequency spreading, in which the frequency of the input clock signal is varied as $f_1$, $f_2$, $f_3$ . . . , can be used to avoid energy concentration at a particular frequency, and can relax the radio disturbance and reduce the impact on other electronic equipment. However, when a plurality of delay-locked loop circuits are coupled in parallel, they are configured to delay-synchronize to the clock (edge) of the next period, so in the frequency spreading, different delay amounts for the next period are reflected (in other words, the delay and pulse width adjusted one period earlier are reflected), fluctuations in the delay amount or pulse width as represented by "output" in FIG. 14 occur. This affects ranging accuracy, which is a problem in the ToF system where input-output propagation delay is critical.

On the other hand, in the present embodiment, the pulse generation circuit 10 couples the first delay-locked loop circuit 50 and the second delay-locked loop circuit 60 in series, therefore the second delay-locked loop circuit 60 can generate a delay for the pulse width with reference to the first delay signal output by the first delay-locked loop circuit 50. In the present embodiment, because the pulse generation circuit 10 can determine the delay amount by the pulse width of the input clock signal and the current ratio (I_UP2/I_DN2) of the charge pump of the second delay-locked loop circuit 60, it can generate a predetermined delay even when the clock signal is frequency spread.

Figure 15:
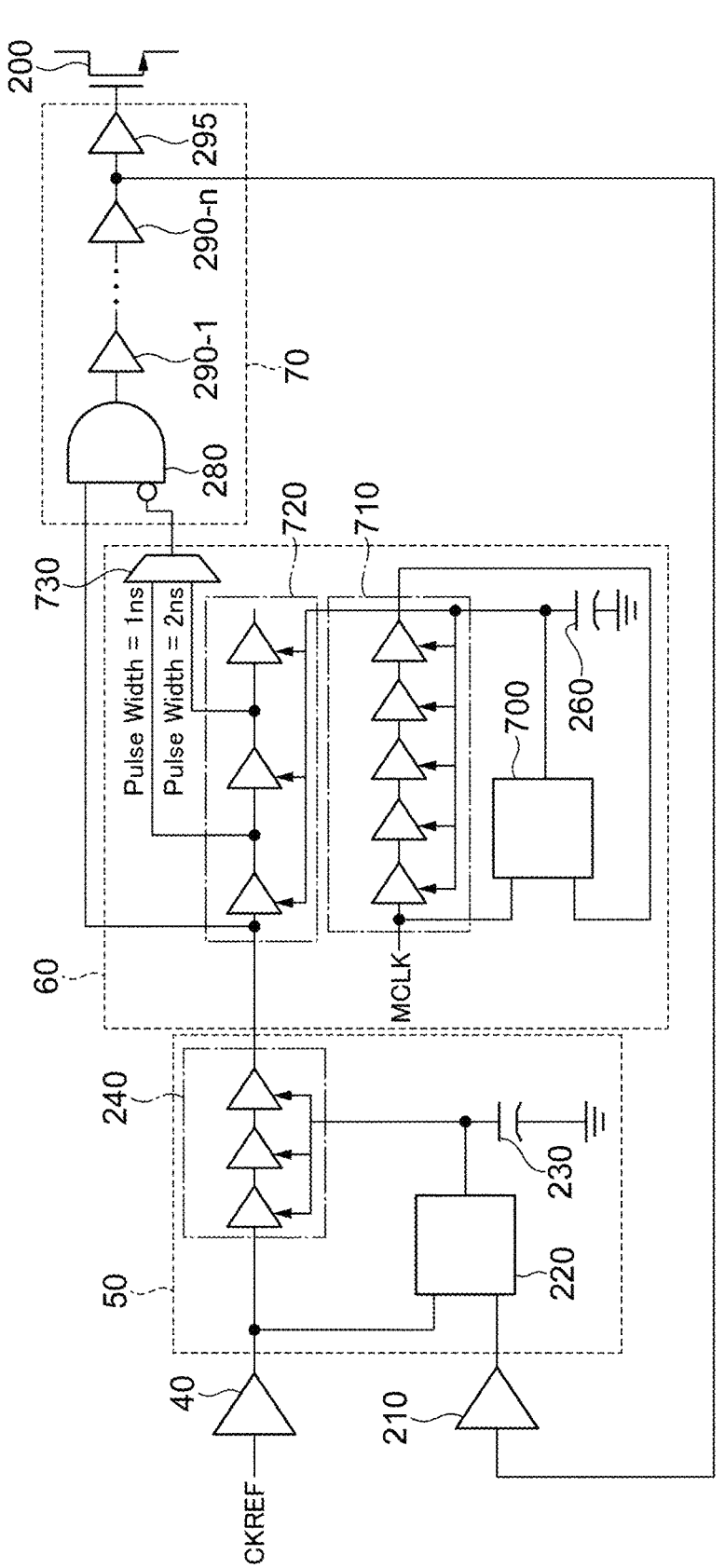
FIG. 15 illustrates a second exemplary configuration of the pulse generation circuit 10.

FIG. 15 illustrates a second exemplary configuration of the pulse generation circuit 10. In the following, the second exemplary configuration of the pulse generation circuit 10 is described mainly in terms of the points different from the first exemplary configuration.

The first delay-locked loop circuit 50 in the second exemplary configuration has a configuration similar to the first exemplary configuration and performs operations similar to the first exemplary configuration, except that the first delay circuit 240 has three buffers. The three buffers may have configurations and perform operations similar to the buffers 350, 352, 354 of the first delay circuit 240 in the first exemplary configuration.

The output circuit 70 in the second exemplary configuration has a coupling circuit 280, n predrivers 290-1 to 290-*n* (n>2), and a predriver 295. The coupling circuit 280 and the predriver 295 may have configurations and perform operations similar to the first exemplary configuration. The n predrivers 290-1 to 290-*n* are coupled in series between the coupling circuit 280 and the predriver 295.

The second delay-locked loop circuit 60 has a second delay control unit 700, a second capacitor 260, a second delay circuit 720, a third delay circuit 710 and a switching unit 730. The second delay control unit 700 receives a reference signal MCLK at one input, and has its another input coupled to the output of the third delay circuit 710. The second capacitor 260 is coupled between the node to which the output of the second delay control unit 700 is coupled and the reference potential. The second delay circuit 720 is coupled to the first delay circuit 240, and coupled to the opposite side of the reference potential of the second capacitor 260. The third delay circuit 710 receives the reference signal MCLK. Herein, the reference signal MCLK may be a master clock signal, which may be a signal different from the clock signal CKREF.

The switching unit 730 has the plurality of inputs coupled to the second delay circuit 720, and its output coupled to the output circuit 70. The switching unit 730 may switch the second delay signal delayed in the second delay circuit 720 according to the pulse width of the delayed pulse signal (1 ns or 2 ns) and output it to the output circuit 70.

Figure 16:
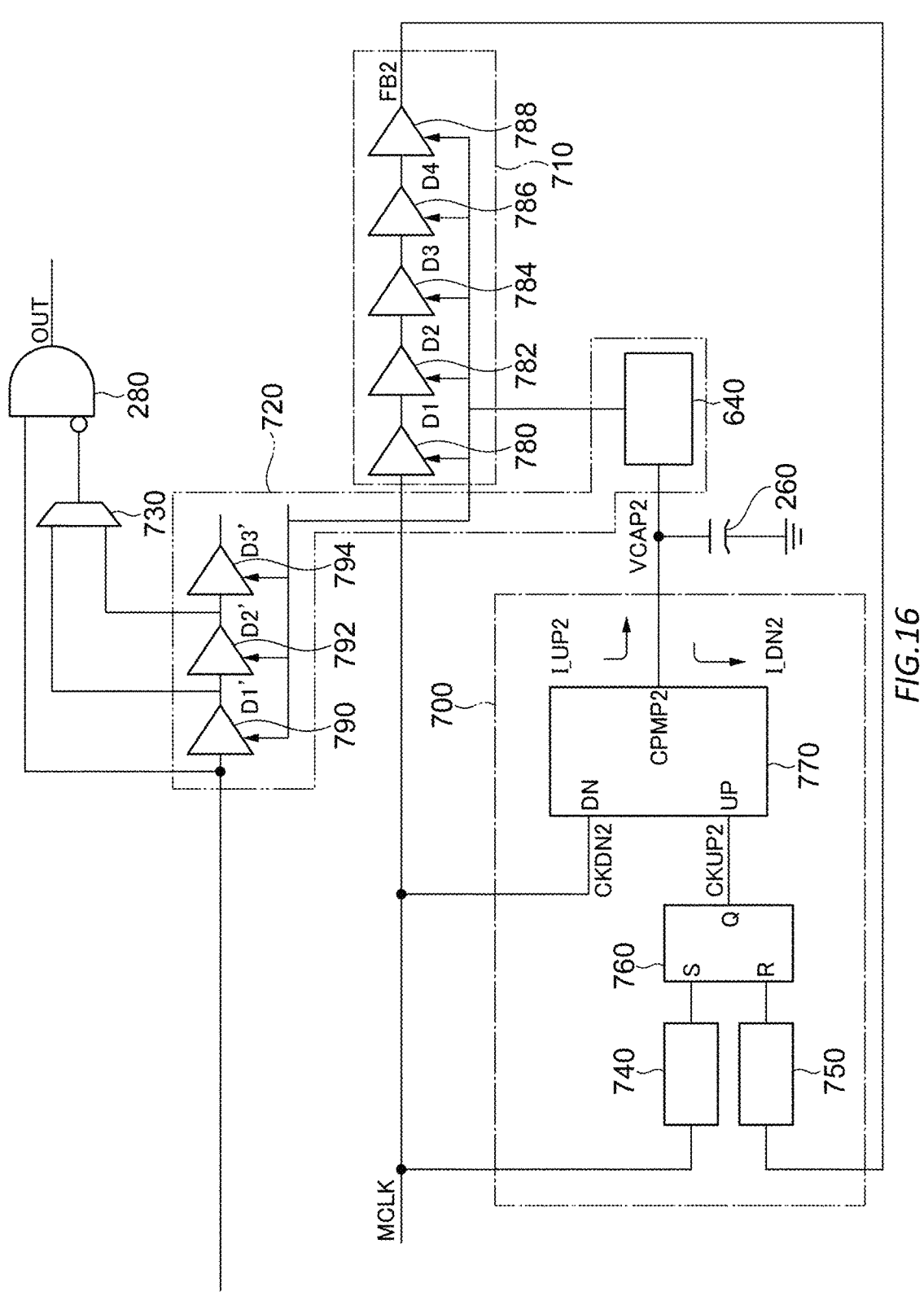
FIG. 16 illustrates a more detailed configuration of the second delay-locked loop circuit 60 in the second exemplary configuration.

FIG. 16 illustrates a more detailed configuration of the second delay-locked loop circuit 60 in the second exemplary configuration. The second delay control unit 700 has a third pulse generation unit 740, a fourth pulse generation unit 750, a second latch unit 760 and a second charge pump 770.

The third pulse generation unit 740 has its input coupled to the terminal that receives the reference signal MCLK, and its output coupled to the second latch unit 760. The third pulse generation unit 740 may rise when the reference signal MCLK has changed (for example, has risen), and generate the third pulse signal with a predetermined pulse width. The third pulse generation unit 740 may output the third pulse signal to one input of the second latch unit 760.

The fourth pulse generation unit 750 has its input coupled to the output of the third delay circuit 710, and its output coupled to the second latch unit 760. The fourth pulse generation unit 750 generates a fourth pulse signal according to a third delay signal FB2 fed back from the third delay circuit 710. The fourth pulse generation unit 750 may generate the fourth pulse signal with a predetermined pulse width that rises when the third delay signal FB2 has changed (for example, has risen). The fourth pulse generation unit 750 may output the fourth pulse signal to another input of the second latch unit 760.

The second latch unit 760 has its output coupled to one input of the second charge pump 770. The second latch unit 760 outputs the third control signal CKUP2 according to the third pulse signal and the fourth pulse signal that are input. The second latch unit 760 may perform the SR latch according to the third pulse signal and the fourth pulse signal, and output the third control signal CKUP2.

The second charge pump 770 has its another input coupled to the terminal that receives the reference signal MCLK, and its output coupled to the node between the second capacitor 260 and the second delay circuit 720. The second charge pump 770 may output the current according to the reference signal MCLK and the third delay signal FB2. The second charge pump 770 may receive a signal fixed to be high as the fourth control signal CKDN2, and output the current I_UP2/I_DN2 according to the third control signal CKUP2 and the fourth control signal CKDN2, which are according to the third delay signal FB2. The second charge pump 770 may change the direction of the current I_UP2/I_DN2 according to the third control signal CKUP2 and a fourth control signal CKDN2, and perform charging or discharging on the second capacitor 260. In this manner, the charging or discharging of the second capacitor 260 increases or decreases the voltage VCAP2 at the node between the second capacitor 260 and the second delay circuit 720.

The second delay circuit 720 has a second current application unit 640, and a plurality of buffers 790, 792, 794. The second current application unit 640 and the plurality of buffers 790, 792, 794 have configurations and perform operations similar to the second current application unit 640 and the plurality of buffers 650 to 654 in the first exemplary configuration.

The third delay circuit 710 receives the reference signal MCLK, and outputs the third delay signal FB2 obtained by delaying the reference signal MCLK according to the current output by the second charge pump 770. The third delay circuit 710 has a plurality of buffers 780, 782, 784, 786, 788 coupled in series between the terminal that receives the reference signal MCLK and the fourth pulse generation unit 750. The plurality of buffers 780, 782, 784, 786, 788 may be coupled between the output of the second current application unit 640 and the reference potential. Similar to the buffers 790, 792, 794 of the second delay circuit 720, the plurality of buffers 780, 782, 784, 786, 788 may receive the current supplied from the second current application unit 640 according to the voltage VCAP2, and output the third delay signal FB2 obtained by delaying the reference signal MCLK.

Each of the buffers 780, 782, 784, 786, 788 of the third delay circuit 710 may have the same size as each of the buffers 790, 792, 794 of the second delay circuit 720. As one example, each of the buffers 780, 782, 784, 786, 788 in the third delay circuit 710 may produce the same delay amount for a signal when the same current amount is supplied from the second current application unit 640 to each of the buffers 790, 792, 794 in the second delay circuit 720. Each of the buffers 780, 782, 784, 786, 788 of the third delay circuit 710 may have a different size in a predetermined ratio to each of the buffers 790, 792, 794 of the second delay circuit 720. As one example, if the same current amount is supplied to the second delay circuit 720 and the third delay circuit 710 from the second current application unit 640, each of the buffers 780, 782, 784, 786, 788 of the third delay circuit 710 may produce a delay amount x for the signal, and each of the buffers 790, 792, 794 of the second delay circuit 720 may produce a delay amount y×x (y>1 or y<1) for the signal.

The switching unit 730 is coupled to each output of a plurality of buffers 790, 792 of the second delay circuit 720, receiving a plurality of second delay signals with different delay amounts. The switching unit 730 may output the second delay signal with a delay amount corresponding to a pulse width predetermined or designated by a user among the plurality of input second delay signals to the output circuit 70. The switching unit 730 may be coupled to the outputs of all of the buffers 790, 792, 794 of the second delay circuit 720.

Figure 17:
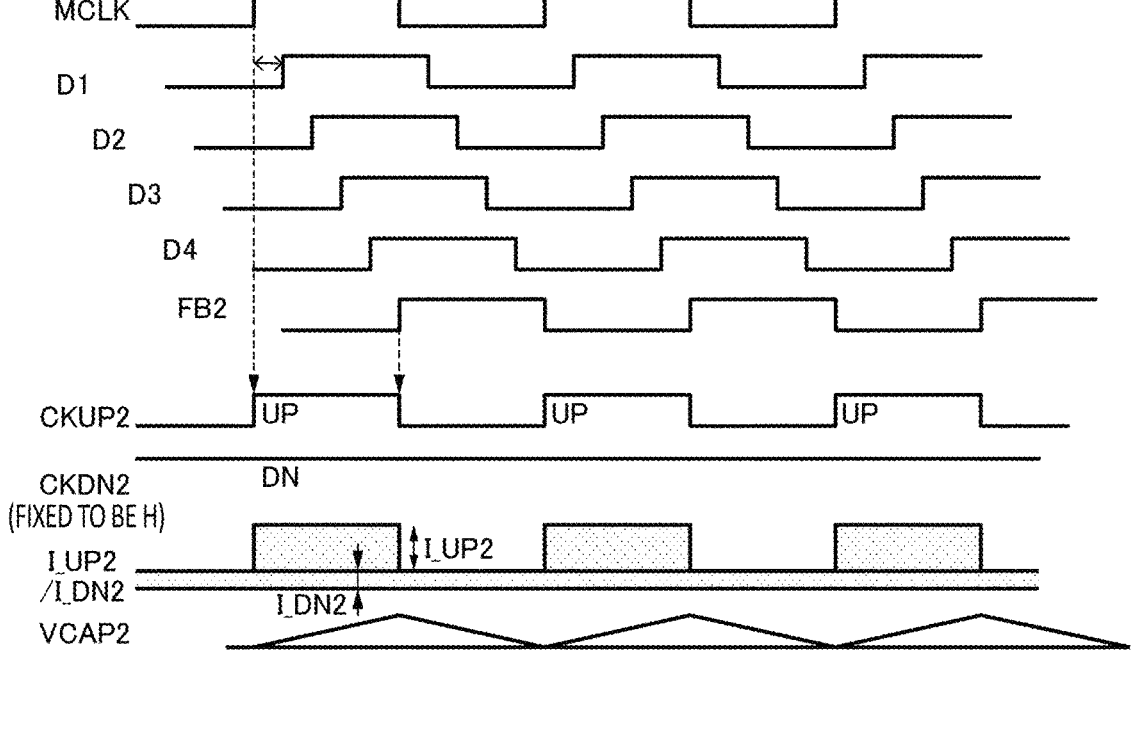
FIG. 17 illustrates one example of a timing chart of the second delay-locked loop circuit 60 in the second exemplary configuration.
Figure 17:
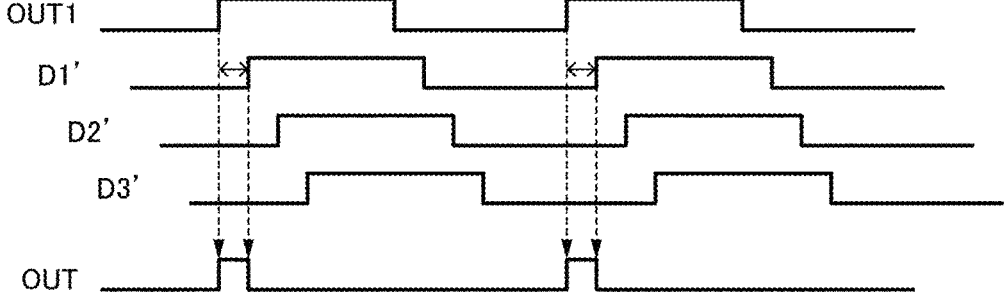

FIG. 17 illustrates one example of a timing chart of the second delay-locked loop circuit 60 in the second exemplary configuration. In the timing chart, MCLK represents the reference signal, D1 represents the signal output from the buffer 780, D2 represents the signal output from the buffer 782, D3 represents the signal output from the buffer 784, D4 represents the signal output from the buffer 786, FB2 represents the signal output from the buffer 788, CKUP2 represents the signal output from the second latch unit 760, CKDN2 represents the signal fixed to be high, which is input to the second charge pump 770, I_UP2/I_DN2 represents the current output from the second charge pump 770, VCAP2 represents the voltage of the second capacitor 260, OUT1 represents the first delay signal, D1' represents the signal output from the buffer 790, D2' represents the signal output from the buffer 792, D3' represents the signal output from the buffer 794 and OUT represents the delayed pulse signal output from the output circuit 70.

In FIG. 17, the third delay circuit 710 delays the reference signal MCLK to output the signals D1 to D4, FB2 by each of the buffers 780, 782, 784, 786, 788. The second latch unit 760 detects the first edges of the reference signal MCLK and the third delay signal FB2 (odd-numbered edges thereafter) and inputs the third control signal CKUP2 according to the detection to the second charge pump 770. The third control signal CKUP2 changes to one logic (a first logic) when the reference signal MCLK has changed to the first logic (high as one example) and changes to another logic (a second logic (low as one example)) when the third delay signal FB2 has changed to the first logic.

The second charge pump 770 charges the current I_UP2 into the second capacitor 260 from the first edge of the reference signal MCLK to the first edge of the signal FB2 by the third control signal CKUP2. On the other hand, the second charge pump 770 discharges the current I_DN2 from the second capacitor 260 by the fourth control signal CKDN2. The second charge pump 770 charges the difference I_UP2–I_DN2 of the currents to the second capacitor 260 during the third control signal CKUP2 being high to increase the voltage VCAP2, and discharges the current I_DN1 from the second capacitor 260 during the third control signal CKUP2 being low to decrease the voltage VCAP2 and restore the original level. This allows for a constant delay time to be generated. The second delay circuit 720 delays the first delay signal OUT1 to output signals D1' to D3' by each of the buffers 790, 792, 794. The switching unit 730 outputs the signal D1' to the output circuit 70. The output circuit 70 may output the delayed pulse signal OUT with a pulse width from the rising edge of the first delay signal OUT to the rising edge of the signal D1'.

In the present embodiment, the relationship between the pulse width of the delayed pulse signal OUT $P_{Width}$, the periodic of the reference signal MCLK $MCLK_{period}$ and the current ratio of the second charge pump 770 (I_UP2/I_DN2) may be expressed as an expression of $P_{Width}=(MCLK_{period}\times I\_UP2/I\_DN2)/5$.

In the present embodiment as described above, the pulse generation circuit 10 inputs only delay information, which is a voltage, into a path between the input terminal 20 and the output terminal 30, so that the reference signal MCLK input to the second delay-locked loop circuit 60 for delay generation is uncorrelated with the clock signal input to the first delay-locked loop circuit 50. Therefore, even if the clock signal is hopping, the second delay-locked loop circuit 60 can use a stable reference signal MCLK (period or HorL width) that is not hopping. Because the feedback loop path in the second delay-locked loop circuit 60 is different from the output path in the output circuit 70, if the second delay-locked loop circuit 60 for pulse width is locked first, a delayed pulse signal of the width in the middle of the lock is not output. The pulse width of the delayed pulse signal can be fine-tuned by the ratio of the current of the second charge pump 770, and at the same time can be roughly corrected by a factor of 1 or 2 by switching by the switching unit 730.

Figure 18:
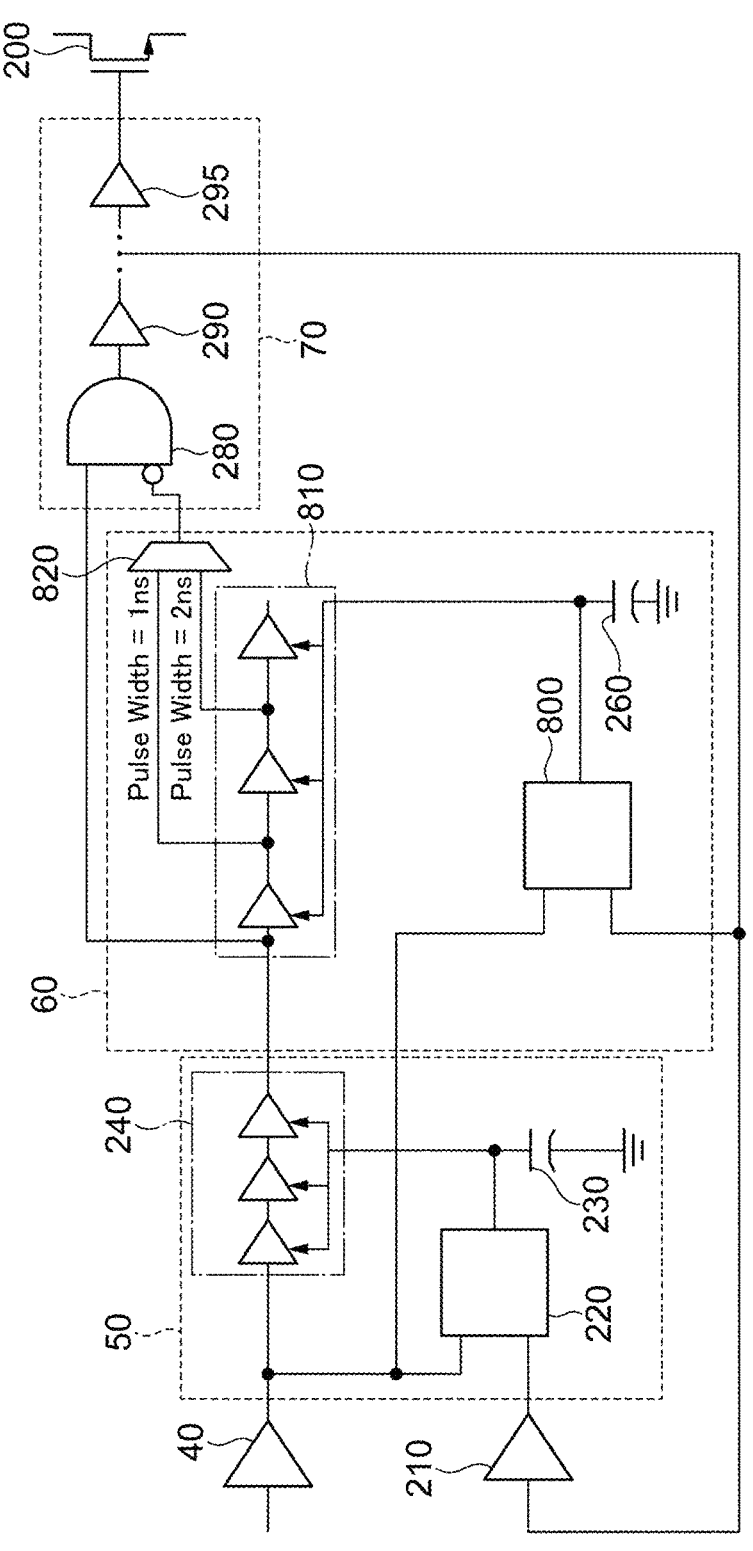
FIG. 18 illustrates a third exemplary configuration of the pulse generation circuit 10.

FIG. 18 illustrates a third exemplary configuration of the pulse generation circuit 10. In the following, the third exemplary configuration of the pulse generation circuit 10 is described mainly in terms of the points different from the first exemplary configuration.

The first delay-locked loop circuit 50 in the third exemplary configuration has a configuration and performs operations similar to the first exemplary configuration, except that the first delay circuit 240 has three buffers. The three buffers may have configurations and operations similar to the buffers 350, 352, 354 of the first delay circuit 240 in the first exemplary configuration. The output circuit 70 in the third exemplary configuration may have configurations and perform operations similar to the second exemplary configuration.

In the third exemplary configuration, the second delay-locked loop circuit 60 has a second delay control unit 800, a second capacitor 260, a second delay circuit 810 and a switching unit 820. The second capacitor 260, the second delay circuit 810 and the switching unit 820 may have configurations and perform operations similar to the second capacitor 260, the second delay circuit 720 and the switching unit 730 in the second exemplary configuration.

The second delay control unit 800 has its one input coupled to the output circuit 70 through the dummy input buffer 210 and its another input coupled to the input terminal 20 through the input buffer 40. The second delay control unit 800 may control the charging/discharging of the second capacitor 260 according to the clock signal and the delayed pulse signal output by the output circuit 70. The second delay control unit 800 may control the charging/discharging of the second capacitor 260 according to the delayed pulse signal output from each node of the output driver 200 instead of the delayed pulse signal output by the output circuit 70.

Figure 19:
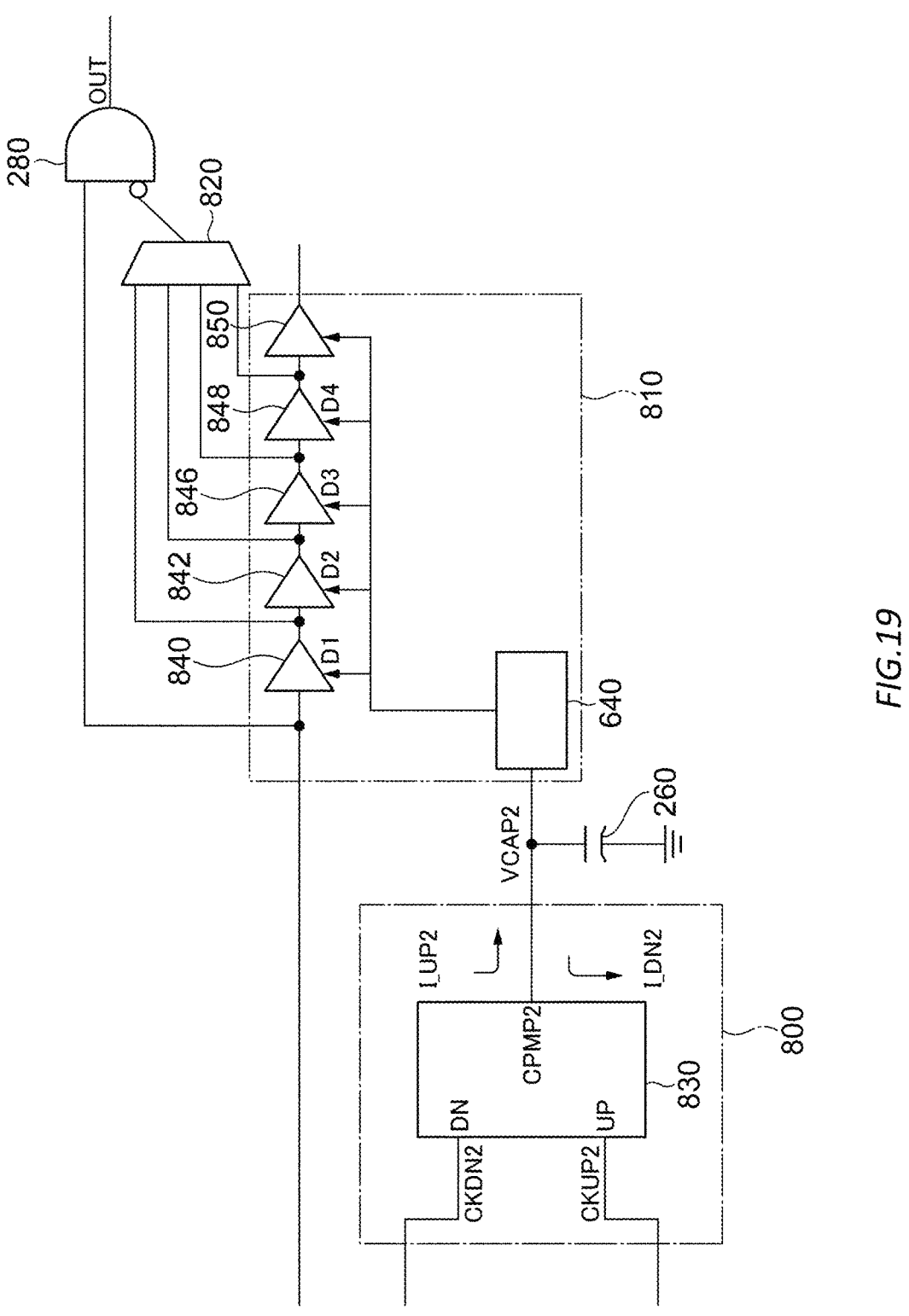
FIG. 19 illustrates a more detailed configuration of the second delay-locked loop circuit 60 of the third exemplary configuration.

FIG. 19 illustrates a more detailed configuration of the second delay-locked loop circuit 60 in the third exemplary configuration. The second delay control unit 800 has a second charge pump 830. The second charge pump 830 has its one input coupled to the output circuit 70 through the dummy input buffer 210, its another input coupled to the input terminal 20 through the input buffer 40, and its output coupled to the node between the second capacitor 260 and the second delay circuit 810. The second charge pump 830 may output the current to the second capacitor 260 according to the clock signal and the delayed pulse signal. The second charge pump 830 may receive the delayed pulse signal as the third control signal CKUP2, receive the clock signal as the fourth control signal CKDN2, and output the current I_UP2/I_DN2 according to the third control signal CKUP2 and the fourth control signal CKDN2. The second charge pump 830 may change the direction of the current I_UP2/I_DN2 according to the third control signal CKUP2 and the fourth control signal CKDN2, and perform charging or discharging on the second capacitor 260. In this manner, the charging or discharging of the second capacitor 260 increases or decreases the voltage VCAP2 at the node between the second capacitor 260 and the second delay circuit 810.

The second delay circuit 810 has a second current application unit 640 and a plurality of buffers 840, 842, 846, 848, 850. The second current application unit 640 and the plurality of buffers 840, 842, 846, 848, 850 may have configurations and perform operations similar to the second current application unit 640 and the plurality of buffers 650 to 658 in the first exemplary configuration.

The switching unit 820 is coupled to each output of the plurality of buffers 840, 842, 846, 848 of the second delay circuit 810, receiving a plurality of second delay signals with different delay amounts. The switching unit 820 may output the second delay signal with a delay amount corresponding to a pulse width predetermined or designated by a user among the plurality of input second delay signals to the output circuit 70. The switching unit 820 may be coupled to the outputs of all the buffers 840, 842, 846, 848, 850 of the second delay circuit 810.

Figure 20:
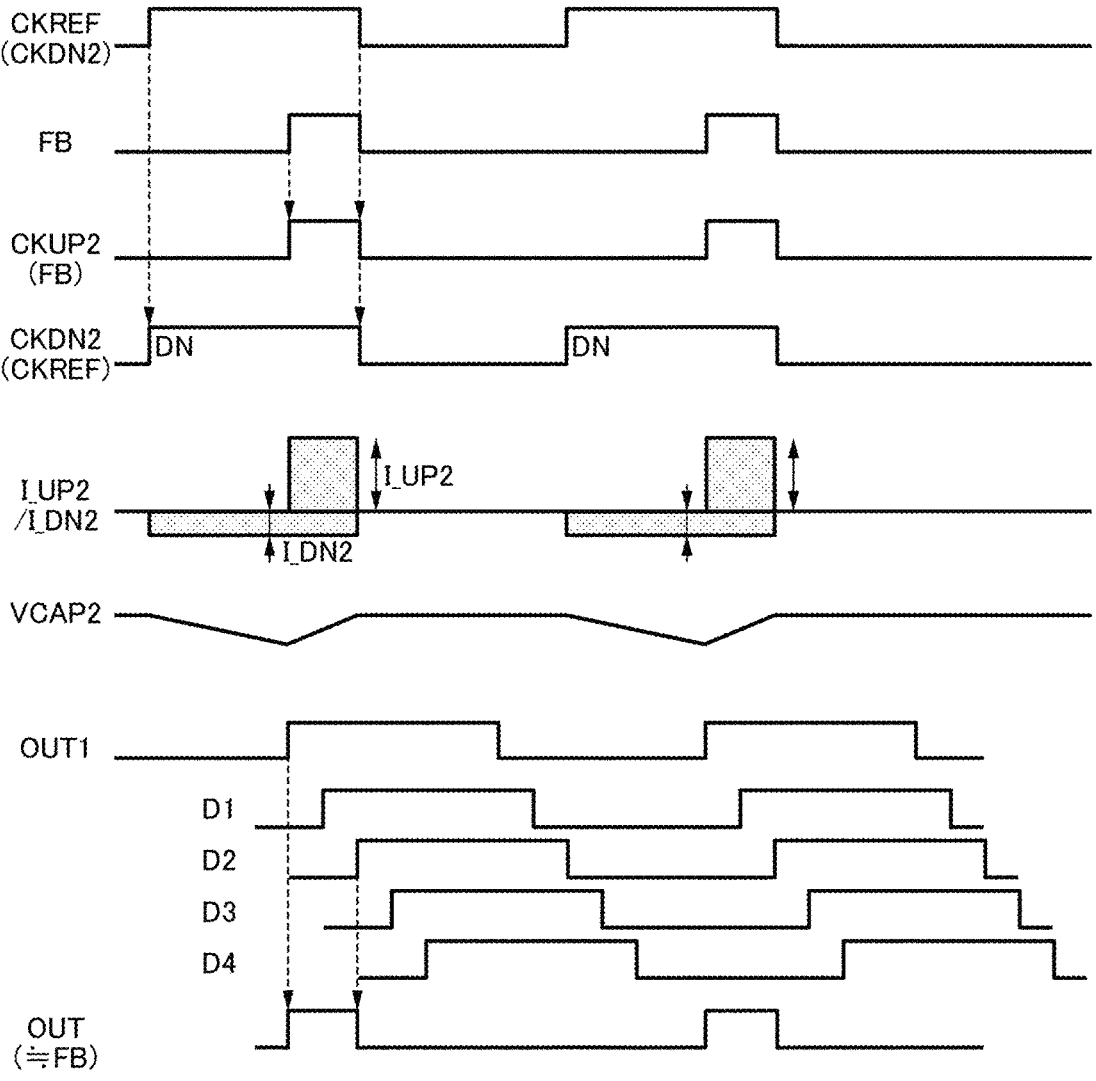
FIG. 20 illustrates one example of a timing chart of the second delay-locked loop circuit 60 in the third exemplary configuration.

FIG. 20 illustrates one example of a timing chart of the second delay-locked loop circuit 60 in the third exemplary configuration. In the timing chart, CKREF (CKDN2) represents the clock signal, FB (CKUP2) represents the delayed pulse signal OUT output from the output circuit 70, I_UP2/I_DN2 represents the current output from the second charge pump 830, VCAP2 represents the voltage of the second capacitor 260, OUT1 represents the first delay signal output from the first delay-locked loop circuit 50, D1 represents the signal output from the buffer 840, D2 represents the signal output from the buffer 842, D3 represents the signal output from the buffer 846, and D4 represents the signal output from the buffer 848.

In FIG. 20, the second delay circuit 810 delays the first delay signal OUT1 to output the signals D1 to D4 by each of the buffers 840, 842, 846, 848. FIG. 20 illustrates a case where the switching unit 820 selects to output the signal D2 output by the buffer 842.

The second charge pump 830 discharges the current I_DN2 from the second capacitor 260, from the first edge to the second edge of the clock signal CKREF by the third control signal CKUP2. On the other hand, the second charge pump 830 charges the current I_UP2 into the second capacitor 260 from the first edge to the second edge (even-numbered edge thereafter) of the delayed pulse signal FB by the fourth control signal CKDN2. The current values of the current I_UP2 and the current I_DN2 may be set by the relationship between the first delay signal OUT1 and the delay of the delayed pulse signal FB. The second charge pump 830 discharges the current I_DN1 from the second capacitor 260 from the first edge to the second edge of the clock signal CKREF to decrease the voltage VCAP2, and charges the difference of the current (I_UP2−I_DN 2) to the second capacitor 260 from the first edge to the second edge of the delayed pulse signal FB to increase the voltage VCAP2 and restore the original level. This allows for a constant delay time to be generated.

In the present embodiment, a relationship between a pulse width of the delayed pulse signal FB $P_{Width}$, a pulse width of the clock signal CKREF $IN_{Width}$ and a current ratio of the second charge pump 830 (I_UP2/I_DN2) may be expressed as an expression of $P_{Width}=IN_{Width}×I\_UP2/I\_DN2$.

In the present embodiment described above, the pulse generation circuit 10 feeds back the output of the predriver 290 to the second delay-locked loop circuit 60, and adjusts/corrects the output of the second delay-locked loop circuit 60 with a pulse width of the clock signal and a current ratio of the charge pump circuit, thereby can reduce the effect of process variations, fluctuations in temperature characteristics and other factors on the delay amount.

The number of buffers in the second delay circuit of the second delay-locked loop circuit 60 in the first exemplary configuration to the third exemplary configuration example is not limited to the above-described embodiments, and the range of pulse width of the delayed pulse signal can be extended by increasing the number of stages.

While the present invention has been described by way of the embodiments, the technical scope of the present invention is not limited to the scope described in the above-described embodiments. It is apparent to persons skilled in the art that various alterations or improvements can be made to the above-described embodiments. It is also apparent from description of the claims that the embodiments to which such modifications or improvements are made may be included in the technical scope of the present invention.

It should be noted that each process of the operations, procedures, steps, stages, and the like performed by the apparatus, system, program, and method shown in the claims, specification, or drawings can be executed in any order as long as the order is not indicated by "prior to", "before", or the like and as long as the output from a previous process is not used in a later process. Even if the operation flow is described using phrases such as "first" or "next" for the sake of convenience in the claims, specification, or drawings, it does not necessarily mean that the process must be performed in this order.

What is claimed is:

1. A pulse generation circuit that receives a clock signal and outputs a delayed pulse signal, comprising:
    a first delay-locked loop circuit that receives the clock signal and generates a first delay signal obtained by delaying the clock signal;
    a second delay-locked loop circuit that generates a second delay signal with reference to the first delay signal; and
    an output circuit that outputs the delayed pulse signal according to the first delay signal and the second delay signal.

2. The pulse generation circuit according to claim 1, wherein the second delay-locked loop circuit has:
    a second charge pump that outputs a current corresponding to a delay amount of the second delay signal; and
    a second delay circuit that outputs the second delay signal obtained by delaying the first delay signal with the delay amount according to a current output by the second charge pump.

3. The pulse generation circuit according to claim 1, wherein the first delay-locked loop circuit has:
    a first charge pump that outputs a current according to the clock signal and the delayed pulse signal; and
    a first delay circuit that outputs the first delay signal obtained by delaying the clock signal according to a current output by the first charge pump.

4. The pulse generation circuit according to claim 2, wherein:
    the second delay-locked loop circuit has a capacitor coupled between a node to which an output of the second charge pump is coupled and reference potential;

the second delay circuit outputs the second delay signal obtained by delaying the first delay signal with the delay amount according to a ratio of a charge current that performs charge of the capacitor and a discharge current that performs discharge of the capacitor, which are output by the second charge pump.

5. The pulse generation circuit according to claim 2, wherein the second charge pump outputs a current according to the first delay signal or the clock signal, and a delay difference between the first delay signal and the second delay signal.

6. The pulse generation circuit according to claim 2, wherein the second charge pump outputs a current according to a signal based on the clock signal and the delayed pulse signal.

7. The pulse generation circuit according to claim 1, wherein the output circuit has:

a coupling circuit that combines the first delay signal and the second delay signal; and a driver that outputs the delayed pulse signal that rises when the first delay signal has changed and falls when the second delay signal has changed.

* * * * *